United States Patent
Im et al.

(10) Patent No.: US 12,074,256 B2
(45) Date of Patent: Aug. 27, 2024

(54) LIGHT-EMITTING DEVICE, METHOD FOR PRODUCING SAME, AND DISPLAY DEVICE INCLUDING SAME

(71) Applicant: SAMSUNG DISPLAY CO., LTD., Yongin-si (KR)

(72) Inventors: Hyun Deok Im, Yongin-si (KR); Jong Hyuk Kang, Yongin-si (KR); Dae Hyun Kim, Yongin-si (KR); Hyun Min Cho, Yongin-si (KR); Dong Hyun Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 645 days.

(21) Appl. No.: 17/284,345

(22) PCT Filed: Apr. 10, 2019

(86) PCT No.: PCT/KR2019/004296
§ 371 (c)(1),
(2) Date: Apr. 9, 2021

(87) PCT Pub. No.: WO2020/075936
PCT Pub. Date: Apr. 16, 2020

(65) Prior Publication Data
US 2021/0359165 A1    Nov. 18, 2021

(30) Foreign Application Priority Data
Oct. 11, 2018    (KR) .......................... 10-2018-0121410

(51) Int. Cl.
*H01L 33/38* (2010.01)
*H01L 25/075* (2006.01)
(Continued)

(52) U.S. Cl.
CPC .......... *H01L 33/38* (2013.01); *H01L 25/0753* (2013.01); *H01L 25/167* (2013.01); *H01L 33/62* (2013.01); *H01L 2933/0066* (2013.01)

(58) Field of Classification Search
CPC ..... H01L 33/38; H01L 33/62; H01L 25/0753; H01L 25/167; H01L 2933/0066
(Continued)

(56) References Cited

U.S. PATENT DOCUMENTS 9,329,433 B2    5/2016    Negishi et al.
9,443,904 B1    9/2016    Chen et al.
(Continued)

FOREIGN PATENT DOCUMENTS

JP    2005-136142    5/2005
JP    2011-211047    10/2011
(Continued)

OTHER PUBLICATIONS

International Search Report, with English translation, corresponding to International Application No. PCT/KR2019/004296 dated Jul. 18, 2019.
(Continued)

*Primary Examiner* — Igwe U Anya
(74) *Attorney, Agent, or Firm* — KILE PARK REED & HOUTTEMAN PLLC

(57) ABSTRACT

A light emitting device may include at least one first electrode and at least one second electrode disposed on different layers on a substrate; a first insulating layer disposed between the first electrode and the second electrode; and at least one light emitting diode electrically connected between the at least one first electrode and the second electrode.

19 Claims, 26 Drawing Sheets

(51) Int. Cl.
*H01L 25/16* (2023.01)
*H01L 33/62* (2010.01)

(58) Field of Classification Search
USPC .......................................................... 257/91
See application file for complete search history.

(56) References Cited

U.S. PATENT DOCUMENTS

| | | | |
|---|---|---|---|
| 9,773,761 | B2 | 9/2017 | Do |
| 9,911,764 | B2 | 3/2018 | Bae et al. |
| 10,340,419 | B2 | 7/2019 | Kim et al. |
| 10,410,577 | B2 | 9/2019 | Lai et al. |
| 10,461,123 | B2 | 10/2019 | Kim et al. |
| 10,818,647 | B2 | 10/2020 | Kim et al. |
| 2013/0027623 | A1 | 1/2013 | Negishi et al. |
| 2017/0062492 | A1 | 3/2017 | Bae et al. |
| 2017/0062514 | A1* | 3/2017 | Park .................... H01L 29/7869 |
| 2017/0294424 | A1* | 10/2017 | Jeong .................... H01L 33/62 |
| 2017/0345801 | A1* | 11/2017 | Lin ........................ H01L 25/075 |
| 2018/0012876 | A1 | 1/2018 | Kim et al. |
| 2018/0026074 | A1 | 1/2018 | Lee et al. |
| 2018/0095571 | A1 | 4/2018 | Park et al. |
| 2018/0122836 | A1 | 5/2018 | Kang et al. |
| 2018/0175009 | A1* | 6/2018 | Kim ........................ H01L 33/20 |
| 2018/0175106 | A1* | 6/2018 | Kim ........................ H01L 33/60 |
| 2018/0247972 | A1 | 8/2018 | Ueno et al. |

FOREIGN PATENT DOCUMENTS

| | | |
|---|---|---|
| JP | 2013-4792 | 1/2013 |
| KR | 10-1163646 | 7/2012 |
| KR | 10-1490758 | 2/2015 |
| KR | 10-2016-0087265 | 7/2016 |
| KR | 10-2017-0026956 | 3/2017 |
| KR | 10-2018-0007025 | 1/2018 |
| KR | 10-2018-0009014 | 1/2018 |
| KR | 10-2018-0072909 | 7/2018 |
| KR | 10-1974086 | 5/2019 |
| KR | 10-2020-0041429 | 4/2020 |
| WO | 2014/149864 | 9/2014 |

OTHER PUBLICATIONS

Written Opinion, with English translation, corresponding to International Application No. PCT/KR2019/004296, dated Jul. 18, 2019.

* cited by examiner

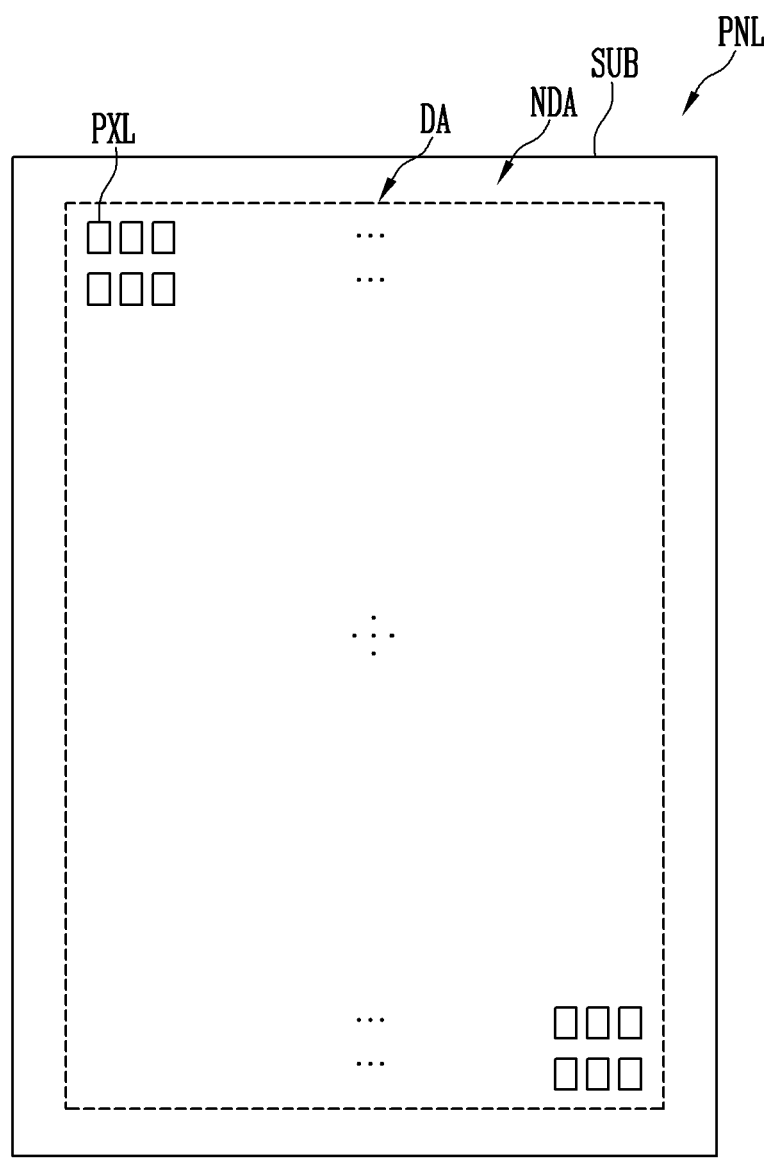

ND, METHOD FOR
PRODUCING SAME, AND DISPLAY DEVICE
INCLUDING SAME

CROSS-REFERENCE TO RELATED APPLICATION(S)

This application is a national entry of International Application No. PCT/KR2019/004296, filed on Apr. 10, 2019, which claims under 35 U.S.C. §§ 119(a) and 365(b) priority to and benefits of Korean Patent Application No. 10-2018-0121410, filed on Oct. 11, 2018 in the Korean Intellectual Property Office, the entire contents of which are incorporated herein by reference.

BACKGROUND

1. Technical Field

Various embodiments of the disclosure relate to a light emitting device, a method of fabricating the light emitting device, and a display device having the light emitting device.

2. Description of Related Art

Recently, a technique of manufacturing a subminiature light emitting diode using a material having a reliable inorganic crystal structure and manufacturing a light emitting device using the light emitting diode has been developed. For example, a technique of manufacturing subminiature light emitting diodes having a small size in a range of the nanoscale to the microscale and forming a light source of a light emitting device using the subminiature light emitting diodes has been developed. Such a light emitting device may be provided in various electronic devices such as a display device and a lighting device.

SUMMARY

Various embodiments of the disclosure are directed to a light emitting device including a light emitting diode, a method of fabricating the light emitting device, and a display device including the light emitting device.

A light emitting device in accordance with an embodiment of the disclosure may include at least one first electrode and at least one second electrode disposed on different layers on the substrate; a first insulating layer disposed between the at least one first electrode and the at least one second electrode; and at least one light emitting diode electrically connected between the at least one first electrode and the at least one second electrode.

In an embodiment, the at least one first electrode and the at least one second electrode may overlap each other in at least one area and be spaced apart from each other, and the first insulating layer may be disposed between the at least one first electrode and the at least one second electrode in the at least one area.

In an embodiment, the at least one light emitting diode may include a first end and a second end in a longitudinal direction of the at least one light emitting diode, and may be disposed adjacent to the at least one first electrode and the at least one second electrode. The first end may be an end of the light emitting diode that faces the at least one first electrode and the at least one second electrode, and the second end may be another end of the at least one light emitting diode.

In an embodiment, the light emitting device may further include a first contact electrode disposed on a first end of the at least one light emitting diode and an area of the at least one first electrode and the at least one second electrode and electrically connecting the first end to the at least one first electrode; and a second contact electrode disposed on a second end of the at least one light emitting diode and electrically connecting the second end to the at least one second electrode.

In an embodiment, the light emitting device may further include a first partition wall disposed between the substrate and the at least one first electrode and the at least one second electrode and disposed adjacent to the first end of the at least one light emitting diode; and a second partition wall disposed between the substrate and the second contact electrode and disposed adjacent to the second end of the at least one light emitting diode.

In an embodiment, the at least one first electrode may be disposed on the first insulating layer. The at least one second electrode may be disposed between the substrate and the first insulating layer to overlap the at least one first electrode.

In an embodiment, in the area where the at least one first electrode and the at least one second electrode overlap each other, the at least one second electrode may have a width greater than a width of the at least one first electrode.

In an embodiment, a first end of the at least one light emitting diode may be disposed to face the at least one first electrode. At least one area of the at least one light emitting diode may overlap the at least one second electrode.

In an embodiment, the light emitting device may further include at least one partition wall disposed between the substrate and the at least one second electrode and disposed adjacent to an end of the at least one light emitting diode.

In an embodiment, a number of the at least one first electrode and a number of the at least one second electrode may be different from each other. The at least one second electrode may include a first sub-electrode overlapping the at least one first electrode; and at least one second sub-electrode spaced apart from the at least one first electrode and the first sub-electrode in a plan view.

In an embodiment, the at least one light emitting diode may include a rod-type light emitting diode oriented in a horizontal direction between the at least one first electrode and the at least one second electrode in a plan view.

In an embodiment, the at least one first electrode and the at least one second electrode may be spaced apart from each other and do not overlap each other in a plan view.

In an embodiment, each of the at least one first electrode and the at least one second electrode may have a shape of at least one bar extending in an identical direction and be disposed parallel to each other with a constant distance.

In an embodiment, the at least one second electrode may include a bent portion adjacent to the at least one first electrode. The at least one first electrode and at least one second electrode may be spaced apart from each other by a first distance in a first area and be spaced apart from each other by a second distance greater than the first distance in a second area adjacent to the first area.

In an embodiment, the first and the second areas may be successively arranged in an extension direction of each of the at least one first electrode and the at least one second electrode.

In an embodiment, the at least one light emitting diode may be disposed in the first area.

A method of fabricating a light emitting device in accordance with an embodiment of the disclosure may include forming a lower electrode on a substrate; forming a first insulating layer on the substrate to overlap at least the lower electrode; forming an upper electrode on the first insulating layer; supplying at least one light emitting diode on the substrate including the lower electrode and the upper electrode, and aligning the at least one light emitting diode such that an end of the at least one light emitting diode is adjacent to the upper electrode; and electrically connecting the at least one light emitting diode between the lower electrode and the upper electrode.

In an embodiment, the electrically connecting of the at least one light emitting diode between the lower electrode and the upper electrode may include forming a first contact electrode and a second contact electrode that electrically connect ends of the at least one light emitting diode to the upper electrode and the lower electrode, respectively.

In an embodiment, the method may further include forming at least one partition wall on the substrate before the forming of the lower electrode.

A display device in accordance with an embodiment of the disclosure may include a substrate including a display area; and a pixel disposed in the display area. The pixel may include a first electrode and a second electrode disposed on different layers on the substrate; a first insulating layer disposed between the first and the second electrodes; and at least one light emitting diode electrically connected between the first and the second electrodes.

In a light emitting device, a method of fabricating the light emitting device, and a display device including the light emitting device in accordance with embodiments of the disclosure, light emitting diodes may be efficiently arranged between first and second electrodes.

BRIEF DESCRIPTION OF THE DRAWINGS

An additional appreciation according to the embodiments of the disclosure will become more apparent by describing in detail the embodiments thereof with reference to the accompanying drawings, wherein:

FIG. 4 is a plan view schematically illustrating a display device in accordance with an embodiment of the disclosure.

DETAILED DESCRIPTION OF THE EMBODIMENTS

Figure 1A:
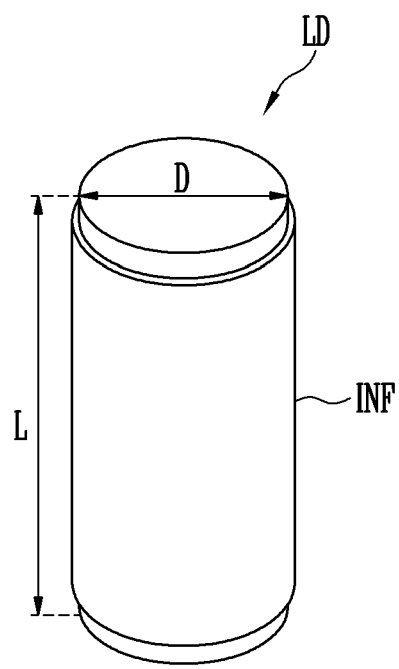
FIGS. 1A and 1B are respectively a perspective view and a cross-sectional view schematically illustrating a light emitting diode in accordance with an embodiment of the disclosure.

Reference will now be made in detail to various embodiments of the disclosure, specific examples of which are illustrated in the accompanying drawings and described below, since the embodiments of the disclosure can be variously modified in many different forms. However, the disclosure is not limited to the following embodiments and may be modified into various forms.

Some elements which are not directly related to the features of the disclosure in the drawings may be omitted to clearly explain the disclosure. Furthermore, the sizes, ratios, etc. of some elements in the drawings may be exaggerated. It should be noted that the same reference numerals are used to denote the same or similar elements throughout the drawings, and repetitive explanation will be omitted.

It will be understood that, although the terms "first," "second," and the like may be used herein to describe various elements, these elements should not be limited by these terms. It will be further understood that the terms "comprise," "include," "have," and the like, when used in this specification, specify the presence of stated features, integers, steps, operations, elements, components, and/or combinations of them but do not preclude the presence or addition of one or more other features, integers, steps, operations, elements, components, and/or combinations thereof. Furthermore, when a first component or part is disposed on a second component or part, the first component or part may be not only directly on the second component or part but a third component or part may intervene between them. Furthermore, the terms "position," "direction," and the like used in the following description are defined in relative terms, and it should be noted that they may be changed into a reverse position or direction depending on a view angle or direction.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

Embodiments and required details of the disclosure are described with reference to the accompanying drawings in order to describe the disclosure in detail so that those having ordinary knowledge in the technical field to which the disclosure pertains can readily practice the disclosure. Furthermore, a singular form may include a plural form as long as it is not specifically mentioned in a sentence.

FIGS. 1A, 1B, 2A, 2B, 3A, and 3B are perspective views and cross-sectional views illustrating light emitting diodes LD in accordance with embodiments. Although FIGS. 1A to 3B illustrate cylindrical rod-type light emitting diodes LD, the type and/or shape of the light emitting diode LD in accordance with the disclosure is not limited thereto.

Figure 1B:
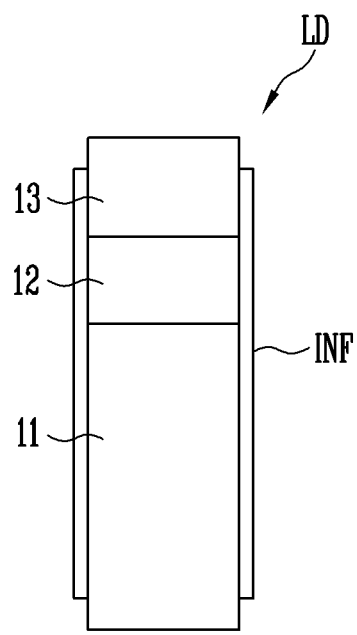

Referring to FIGS. 1A and 1B, a light emitting diode LD in accordance with an embodiment may include a first conductivity type semiconductor layer 11 (or referred to as a "first semiconductor layer"), a second conductivity type semiconductor layer 13 (or referred to as a "second semiconductor layer"), and an active layer 12 interposed between the first and second conductivity type semiconductor layers 11 and 13. For example, the light emitting diode LD may be configured of (or formed of) a stacked body formed by successively stacking the first conductivity type semiconductor layer 11, the active layer 12, and the second conductivity type semiconductor layer 13.

In an embodiment, the light emitting diode LD may be provided in the form of a rod extending in a direction. If the direction in which the light emitting diode LD extends is defined as a longitudinal direction, the light emitting diode LD may have a first end and a second end in the longitudinal direction.

In an embodiment, one of the first and second conductivity type semiconductor layers 11 and 13 may be disposed on the first end of the light emitting diode LD, and the other may be disposed on the second end of the light emitting diode LD.

In an embodiment, the light emitting diode LD may be a rod-type light emitting diode manufactured in the form of a rod. In this specification, the term "rod-type shape" may mean a rod-like shape or a bar-like shape such as a cylindrical shape and a prismatic shape extending in a longitudinal direction (i.e., having an aspect ratio greater than 1), and the cross-sectional shape thereof is not limited to a particular shape. For example, a length L of the light emitting diode LD may be greater than a diameter D thereof (or a width of the cross-section thereof).

In an embodiment, the light emitting diode LD may have a small size in a range of the nanoscale to the microscale, e.g., a diameter D and/or a length L ranging from the nanoscale to the microscale. However, in the disclosure, the size of the light emitting diode LD is not limited thereto. For example, the size of the light emitting diode LD may be changed in various ways depending on design conditions of various devices, e.g., display devices which employ, as a light source, a light emitting device using a light emitting diode LD.

The first conductivity type semiconductor layer 11 may include, for example, at least one n-type semiconductor layer. For instance, the first conductivity type semiconductor layer 11 may include an n-type semiconductor layer which includes any one semiconductor material of InAlGaN, GaN, AlGaN, InGaN, AlN, and InN and is doped with a first conductive dopant such as Si, Ge, or Sn. However, the material for forming the first conductivity type semiconductor layer 11 is not limited thereto, and the first conductivity type semiconductor layer 11 may be formed of various other materials.

The active layer 12 may be disposed on the first conductivity type semiconductor layer 11 and may have a single or multiple quantum well structure. In an embodiment, a cladding layer (not shown) doped with a conductive dopant may be formed on and/or under the active layer 12. For example, the cladding layer may be formed of an AlGaN layer or an InAlGaN layer. In an embodiment, a material such as AlGaN or AlInGaN may be used to form the active layer 12, and various other materials may be used to form the active layer 12.

If an electric field of a predetermined voltage or more is applied to the opposite ends of the light emitting diode LD, the light emitting diode LD may emit light by recombination of electron-hole pairs in the active layer 12. Since light emission of the light emitting diode LD can be controlled in accordance with the foregoing principle, the light emitting diode LD may be used as a light source of various light emitting devices as well as a pixel of a display device.

The second conductivity type semiconductor layer 13 may be disposed on the active layer 12 and may include a semiconductor layer of a type different from that of the first conductivity type semiconductor layer 11. For example, the second conductivity type semiconductor layer 13 may include at least one p-type semiconductor layer. For instance, the second conductivity type semiconductor layer 13 may include a p-type semiconductor layer which includes any one of InAlGaN, GaN, AlGaN, InGaN, AlN, and InN and is doped with a second conductive dopant such as Mg. However, the material forming the second conductivity type semiconductor layer 13 is not limited thereto, and the second conductivity type semiconductor layer 13 may be formed of various other materials.

In an embodiment, the light emitting diode LD may further include an insulating film INF provided on the surface of the light emitting diode LD. In an embodiment, the insulating film INF may be formed on the surface of the light emitting diode LD to enclose an outer circumferential surface of at least the active layer 12. The insulating film INF may further enclose an area of each of the first and second conductivity type semiconductor layers 11 and 13. Here, the insulating film INF may allow the opposite ends of the light emitting diode LD that have different polarities to be exposed to the outside. For example, the insulating film INF may expose an end of each of the first and second conductivity type semiconductor layers 11 and 13 that are disposed on the respective opposite ends of the light emitting diode LD in the longitudinal direction, and may expose, for example, two base sides (the top and bottom surfaces) of the cylinder rather than covering the two base sides.

In an embodiment, the insulating film INF may include at least one insulating material of $SiO_2$, $Si_3N_4$, $Al_2O_3$, and $TiO_2$, but the disclosure is not limited thereto. The material that forms the insulating film INF is not limited to a particular material, and the insulating film INF may be formed of various known insulating materials.

In an embodiment, the light emitting diode LD may further include additional components as well as the first conductivity type semiconductor layer 11, the active layer 12, the second conductivity type semiconductor layer 13, and/or the insulating film INF. For example, the light emitting diode LD may further include at least one fluorescent layer, at least one active layer, at least one semiconductor layer, and/or at least one electrode layer disposed on an end of the first conductivity type semiconductor layer 11, the active layer 12, and/or the second conductivity type semiconductor layer 13.

Figure 2A:
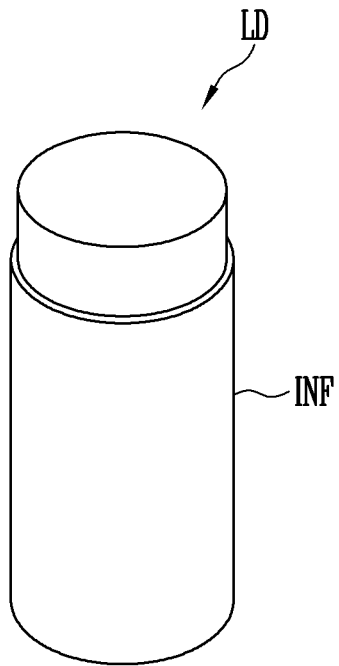
FIGS. 2A and 2B are respectively a perspective view and a cross-sectional view schematically illustrating a light emitting diode in accordance with an embodiment of the disclosure.
Figure 2B:
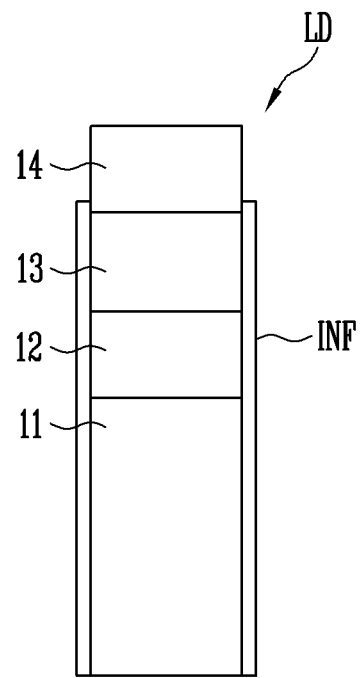
Figure 3A:
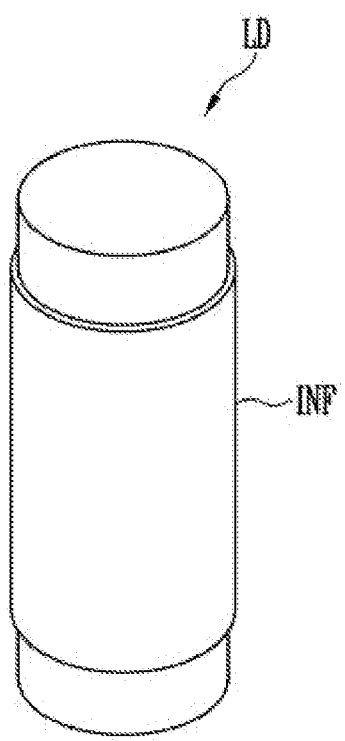
FIGS. 3A and 3B are respectively a perspective view and a cross-sectional view schematically illustrating a light emitting diode in accordance with an embodiment of the disclosure.
Figure 3B:
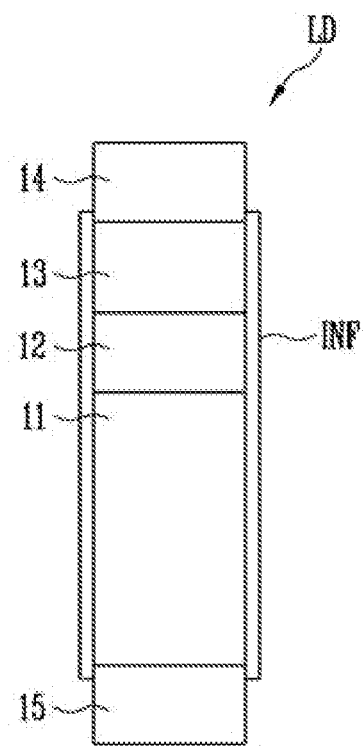

For example, as shown in FIGS. 2A and 2B, the light emitting diode LD may further include at least one electrode layer 14 disposed on an end of the second conductivity type semiconductor layer 13. In an embodiment, as shown in FIGS. 3A and 3B, the light emitting diode LD may further include at least one electrode layer 15 disposed on an end of the first conductivity type semiconductor layer 11.

Each of the electrode layers 14 and 15 may be an ohmic contact electrode, but the disclosure is not limited thereto. Furthermore, each of the electrode layers 14 and 15 may include metal or a metal oxide. For example, Cr, Ti, Al, Au, Ni, ITO, IZO, ITZO, and an oxide or alloy thereof may be used alone or in combination with each other. In an embodiment, the electrode layers 14 and 15 may be substantially transparent or translucent. Therefore, light generated from the light emitting diode LD may be emitted out of the light emitting diode LD through the electrode layers 14 and 15.

In an embodiment, the insulating film INF may at least partially enclose outer circumferential surfaces of the electrode layers 14 and 15 or may not enclose the outer circumferential surfaces. In other words, the insulating film INF may be selectively formed on the surfaces of the electrode layers 14 and 15. Furthermore, the insulating film INF may be formed to allow the opposite ends of the light emitting diode LD having different polarities to be exposed, and may allow, for example, at least one area of each of the electrode layers 14 and 15 to be exposed. As another example, in an embodiment, the insulating film INF may not be provided.

If the insulating film INF is provided on the surface of the light emitting diode LD, particularly, on the surface of the active layer 12, the active layer 12 may be prevented from short-circuiting with at least one electrode (e.g., at least one of contact electrodes electrically connected to the opposite ends of the light emitting diode LD), which is not illustrated. Therefore, the electrical stability of the light emitting diode LD may be secured.

Furthermore, thanks to the insulating film INF formed on the surface of the light emitting diode LD, occurrence of a defect on the surface of the light emitting diode LD may be reduced or minimized, whereby the lifetime and efficiency of the light emitting diode LD may be improved. If the insulating film INF is formed on each light emitting diode LD, in case that light emitting diodes LD are disposed adjacent to each other, the light emitting diodes LD may be prevented from undesirably short-circuiting.

In an embodiment, the light emitting diode LD may be fabricated through a surface treatment process. For example, the light emitting diode LD may be surface-treated (e.g., by a coating process) so that, in case that light emitting diodes LD are mixed with a fluidic solution and then supplied to each light emitting area (e.g., a light emitting area of each pixel), the light emitting diodes LD can be evenly distributed rather than unevenly aggregating in the solution.

The light emitting device including the above-described light emitting diode LD may be used in various devices, including a display device which includes a light source. For instance, at least one subminiature light emitting diode LD, e.g., subminiature light emitting diodes LD each having a size ranging from the nanoscale to the microscale, may be disposed in each pixel area of a display panel so as to form a light source (or a light source unit) of the corresponding pixel. Furthermore, the field of application of the light emitting diode LD according to the disclosure is not limited to a display device. For example, the light emitting diode LD may be used in various devices, such as a lighting device which includes a light source.

FIG. 4 is a plan view schematically illustrating a display device in accordance with an embodiment. In an embodiment, FIG. 4 illustrates a display device, particularly, a display panel PNL provided in the display device, as an example of a device which may use, as a light source, the light emitting diode LD described with reference to FIGS. 1A to 3B. For example, pixels PXL of the display panel PNL each may include a light emitting device. The light emitting device may include at least one light emitting diode LD.

For the sake of explanation, FIG. 4 simply illustrates the structure of the display panel PNL in accordance with an embodiment, focused on a display area DA. In some embodiments, although not illustrated, at least one driving circuit (e.g., at least one of a scan driver and a data driver) and/or lines may be further provided in the display panel PNL.

Referring to FIG. 4, the display panel PNL in accordance with an embodiment may include a substrate SUB, and pixels PXL disposed on the substrate SUB. In detail, the display panel PNL and the substrate SUB for forming the display panel PNL may include a display area DA for displaying an image, and a non-display area NDA formed in a predetermined area other than the display area DA. The pixels PXL may be disposed in the display area DA on the substrate SUB.

In an embodiment, the display area DA may be disposed in a central area of the display panel PNL, and the non-display area NDA may be disposed in a perimeter area of the display panel PNL in such a way as to enclose the display area DA. The locations of the display area DA and the non-display area NDA are not limited thereto, and the locations thereof may be changed.

The substrate SUB may form a base of the display panel PNL. In an embodiment, the substrate SUB may be a rigid or flexible substrate, and the material or properties thereof are not particularly limited. For example, the substrate SUB may be a rigid substrate made of glass or reinforced glass, or a flexible substrate formed of a thin film made of plastic or metal. Furthermore, the substrate SUB may be a transparent substrate, but the disclosure is not limited thereto. For instance, the substrate SUB may be a translucent substrate, an opaque substrate, or a reflective substrate.

An area on the substrate SUB may be defined as the display area DA in which the pixels PXL are disposed, and the other area thereof may be defined as the non-display area NDA. For example, the substrate SUB may include the display area DA including pixel areas in which the respective pixels PXL are formed, and the non-display area NDA disposed around the display area DA. Various lines and/or internal circuits electrically connected to the pixels PXL of the display area DA may be disposed in the non-display area NDA.

In an embodiment, the pixels PXL may be distributed and arranged in the display area DA. In an embodiment, the pixels PXL may be arranged in a stripe shape in the display area DA. However, the disclosure is not limited thereto. For example, the pixels PXL may be arranged in various known shapes in the display area DA.

Each pixel PXL may include at least one light source, which is driven by a predetermined control signal (e.g., a scan signal and a data signal) and/or power (e.g., first and second power), for example, a light emitting diode LD according to one of the embodiments of FIGS. 1A to 3B. For example, each pixel PXL may include at least one light emitting diode LD having a small size ranging from the nanoscale to the microscale. For example, each pixel PXL may include rod-type light emitting diodes which are connected in parallel between pixel electrodes and/or power lines. The rod-type light emitting diodes may form a light emitting device of each pixel PXL (e.g., a light source or a light source unit of each pixel PXL).

In an embodiment, each pixel PXL may be formed of an active pixel. However, the types, structures, and/or driving methods of the pixels PXL being applicable to the display device according to the disclosure are not particularly limited. For example, each pixel PXL and a pixel of various known passive or active light emitting display devices may have the same structure.

Figure 5A:
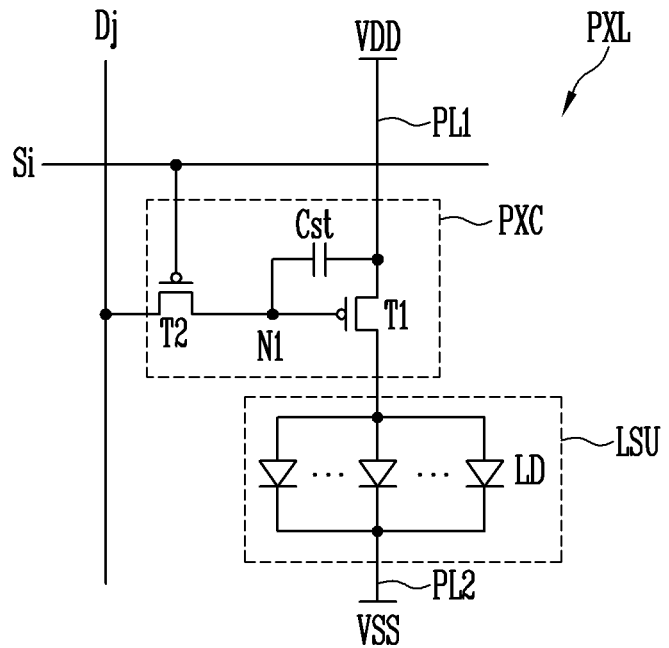
FIGS. 5A to 5C each are a circuit diagram schematically illustrating a light emitting device in accordance with an embodiment of the disclosure, and for example illustrate different embodiments of an active pixel including the light emitting device.
Figure 5B:
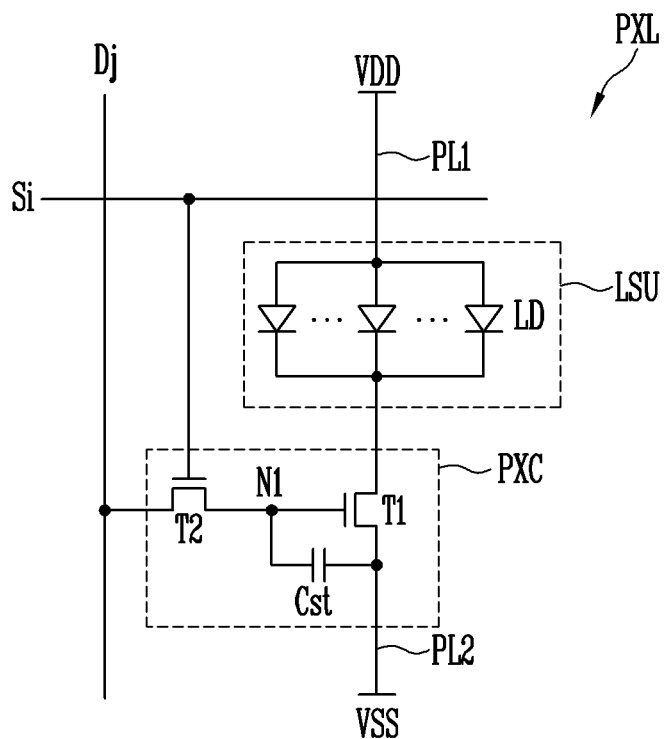
Figure 5C:
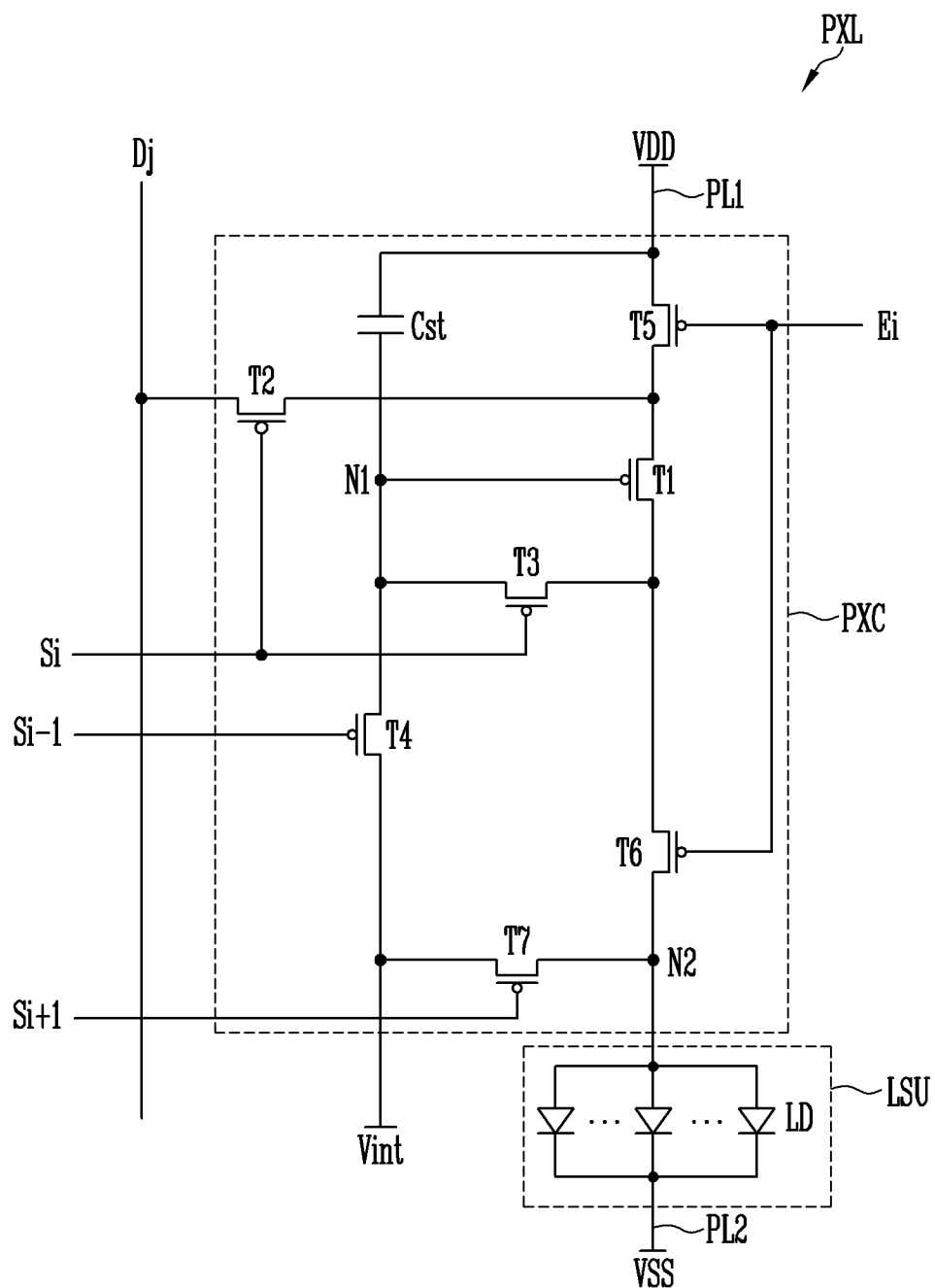

FIGS. 5A to 5C are circuit diagrams illustrating a light emitting device in accordance with an embodiment. For example, FIGS. 5A to 5C illustrate different embodiments of an active pixel PXL including the light emitting device. In an embodiment, each pixel PXL illustrated in FIGS. 5A to 5C may be one of the pixels PXL provided in the display panel PNL of FIG. 4. The pixels PXL may have substantially the same or similar structure(s).

Referring to FIG. 5A, the pixel PXL in accordance with an embodiment may include a light source unit LSU configured to generate light having a luminance corresponding to a data signal, and a pixel circuit PXC configured to drive the light source unit LSU. The light source unit LSU may form a light emitting device in accordance with an embodiment.

In an embodiment, the light source unit LSU may include light emitting diodes LD between a first power supply VDD and a second power supply VSS. In an embodiment, the light emitting diodes LD may be connected in parallel to each other, but the disclosure is not limited thereto. For example, in an embodiment, light emitting diodes LD may be connected in a serial/parallel combined structure between the first power supply VDD and the second power supply VSS.

In an embodiment, the first and second power supplies VDD and VSS may have different potentials to make it possible for the light emitting diodes LD may emit light. For example, the first power supply VDD may be set as a high-potential power supply, and the second power supply VSS may be set as a low-potential power supply. Here, a difference in potential between the first and second power supplies VDD and VSS may be set to a threshold voltage of the light emitting diodes LD or greater during at least a light emitting period of the pixel PXL.

Although FIG. 5A illustrates an embodiment in which the light emitting diodes LD forming the light source unit LSU of each pixel PXL are connected in parallel to each other in the same direction (e.g., in a forward direction) between the first power supply VDD and the second power supply VSS, the disclosure is not limited thereto. For example, in an embodiment, some of the light emitting diodes LD may be electrically connected to each other in a first direction (e.g., the forward direction) between the first and second power supplies VDD and VSS, and the other light emitting diodes LD may be electrically connected to each other in a second direction (e.g., a reverse direction). As another example, in an embodiment, at least one pixel PXL may include only a single light emitting diode LD.

In an embodiment, first ends of the light emitting diodes LD forming each light source unit LSU may be connected in common to a corresponding pixel circuit PXC through a first electrode of the light source unit LSU and may be electrically connected to the first power supply VDD through the pixel circuit PXC and a first power line PL1. Second ends of the light emitting diodes LD may be connected in common to the second power supply VSS through a second electrode of the light source unit LSU and a second power line PL2.

Each light source unit LSU may emit light having a luminance corresponding to a driving current supplied thereto through the corresponding pixel circuit PXC. Therefore, a predetermined image may be displayed in the display area DA.

The pixel circuit PXC may be electrically connected to a scan line Si and a data line Dj of the corresponding pixel PXL. For example, if the pixel PXL is disposed in an i-th row (where i is a natural number) and a j-th column (where j is a natural number) of the display area DA, the pixel circuit PXC of the pixel PXL may be electrically connected to an i-th scan line Si and a j-th data line Dj of the display area DA. The pixel circuit PXC may include first and second transistors T1 and T2, and a storage capacitor Cst.

The first transistor T1 (driving transistor) may be electrically connected between the first power supply VDD and the first electrode of the light source unit LSU. A gate electrode of the first transistor T1 may be electrically connected to a first node N1. The first transistor T1 may control driving current to be supplied to the light source unit LSU in response to a voltage of the first node N1.

The second transistor T2 (switching transistor) may be electrically connected between the data line Dj and the first node N1. A gate electrode of the second transistor T2 may be electrically connected to the scan line Si.

In case that a scan signal of a gate-on voltage (e.g., a low voltage) is supplied from the scan line Si, the second transistor T2 may be turned on to electrically connect the first node N1 to the data line Dj. During each frame period, a data signal of a corresponding frame may be supplied to the data line Dj. The data signal may be transmitted to the first node N1 via the second transistor T2. Therefore, a voltage corresponding to the data signal may be stored in the storage capacitor Cst.

An electrode of the storage capacitor Cst may be electrically connected to the first power supply VDD, and the other electrode thereof may be electrically connected to the first node N1. The storage capacitor Cst may be charged with a voltage corresponding to a data signal supplied to the first node N1 during each frame period and may maintain the charged voltage until a data signal of a subsequent frame is supplied thereto.

FIG. 5A illustrates that the transistors, e.g., the first and second transistors T1 and T2, included in the pixel circuit PXC are P-type transistors, but the disclosure is not limited thereto. In other words, the first transistor and/or the second transistor T1 and T2 may be changed to an N-type transistor.

For example, as shown in FIG. 5B, the first and second transistors T1 and T2 may be N-type transistors. The configuration and operation of the pixel PXL illustrated in FIG. 5B, other than the feature that connection positions of some circuit elements are changed depending on a change in type of the transistors, are substantially similar to those of the pixel PXL of FIG. 5A. Therefore, detailed description of the pixel PXL of FIG. 5B will be omitted.

The structure of the pixel circuit PXC is not limited to the embodiments shown in FIGS. 5A and 5B. In other words, the pixel circuit PXC may be formed of a known pixel circuit which may have various structures and/or be operated by various driving methods. For example, the pixel circuit PXC and an embodiment illustrated in FIG. 5C may be configured in the same manner.

Referring to FIG. 5C, the pixel circuit PXC may be electrically connected to a scan line Si of a corresponding horizontal line and/or to at least another scan line (or control line). For example, the pixel circuit PXC of the pixel PXL disposed in the i-th row of the display area DA may be further electrically connected to an i−1-th scan line Si−1 and/or an i+1-th scan line Si+1. In an embodiment, the pixel circuit PXC may be electrically connected to the first and second power supplies VDD and VSS and/or to other power supplies. For instance, the pixel circuit PXC may also be electrically connected to an initialization power supply Vint. In an embodiment, the pixel circuit PXC may include first to seventh transistors T1 to T7 and a storage capacitor Cst.

The first transistor T1 may be electrically connected between the first power supply VDD and the first electrode of the light source unit LSU. A gate electrode of the first transistor T1 may be electrically connected to a first node N1. The first transistor T1 may control the driving current to be supplied to the light source unit LSU in response to a voltage of the first node N1.

The second transistor T2 may be electrically connected between the data line Dj and an electrode of the first transistor T1. A gate electrode of the second transistor T2 may be electrically connected to the corresponding scan line Si. In case that a scan signal of a gate-on voltage is supplied from the scan line Si, the second transistor T2 may be turned on to electrically connect the data line Dj to the electrode of the first transistor T1. Therefore, if the second transistor T2 is turned on, a data signal supplied from the data line Dj may be transmitted to the first transistor T1.

The third transistor T3 may be electrically connected between the other electrode of the first transistor T1 and the first node N1. A gate electrode of the third transistor T3 may be electrically connected to the corresponding scan line Si. In case that a scan signal of a gate-on voltage is supplied from the scan line Si, the third transistor T3 may be turned on to electrically connect the first transistor T1 in the form of a diode (or diode-connect the first transistor T1).

The fourth transistor T4 may be electrically connected between the first node N1 and the initialization power supply Vint. A gate electrode of the fourth transistor T4 may be electrically connected to a preceding scan line, e.g., an i−1-th scan line Si−1. In case that a scan signal of a gate-on voltage is supplied to the i−1-th scan line Si−1, the fourth transistor T4 may be turned on so that the voltage of the initialization power supply Vint may be transmitted to the first node N1. Here, the voltage of the initialization power supply Vint may be equal to or less than a minimum voltage of a data signal.

The fifth transistor T5 may be electrically connected between the first power supply VDD and the first transistor T1. A gate electrode of the fifth transistor T5 may be electrically connected to a corresponding emission control line, e.g., an i-th emission control line E1. The fifth transistor T5 may be turned off in case that an emission control signal of a gate-off voltage (e.g., high voltage) is supplied to the emission control line E1 and may be turned on in other cases.

The sixth transistor T6 may be electrically connected between the first transistor T1 and a second node N2, which is electrically connected to the first electrode of the light source unit LSU. A gate electrode of the sixth transistor T6 may be electrically connected to a corresponding emission control line, e.g., the i-th emission control line E1. The sixth transistor T6 may be turned off in case that an emission control signal of a gate-off voltage is supplied to the emission control line E1 and may be turned on in other cases.

The seventh transistor T7 may be electrically connected between the second node N2, which is electrically connected to the first electrode of the light source unit LSU, and the initialization power supply Vint. A gate electrode of the seventh transistor T7 may be electrically connected to one of scan lines of a subsequent stage, e.g., to the i+1-th scan line Si+1. In case that a scan signal of a gate-on voltage is supplied to the i+1-th scan line Si+1, the seventh transistor T7 may be turned on so that the voltage of the initialization power supply Vint may be supplied to the first electrode of the light source unit LSU.

The storage capacitor Cst may be electrically connected between the first power supply VDD and the first node N1. The storage capacitor Cst may store a voltage corresponding to the data signal applied to the first node N1 during each frame period and/or to the threshold voltage of the first transistor T1.

FIG. 5C illustrates that the transistors, e.g., the first to seventh transistors T1 to T7, included in the pixel circuit PXC are P-type transistors, but the disclosure is not limited thereto. For example, at least one of the first to seventh transistors T1 to T7 may be changed to an N-type transistor.

The structure of the pixel PXL applicable to the disclosure is not limited to the embodiments illustrated in FIGS. 5A to 5C, and each pixel PXL may have various known structures. For example, the pixel circuit PXC included in each pixel PXL may be formed of a known pixel circuit which may have various structures and/or be operated by various driving methods. In an embodiment, each pixel PXL may be configured in a passive light emitting display device or the like. In this case, the pixel circuit PXC may be omitted, and each of the first and second electrodes of the light source unit LSU may be directly connected to the scan line Si, the data line Dj, a power line, and/or the control line.

Figure 6:
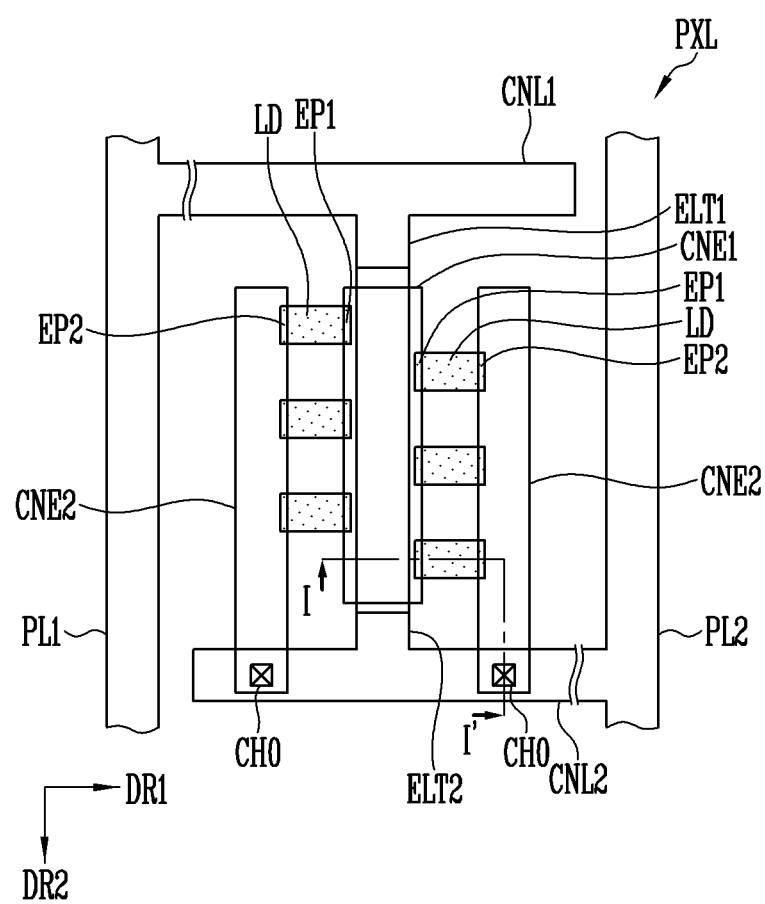
FIG. 6 is a plan view schematically illustrating a light emitting device in accordance with an embodiment of the disclosure, and for example illustrates an embodiment of a pixel formed of the light emitting device.

FIG. 6 is a plan view schematically illustrating a light emitting device in accordance with an embodiment of the disclosure, and for example, illustrates an example pixel PXL including the light emitting device. In an embodiment, FIG. 6 illustrates a light emitting device (e.g., a pixel PXL of a passive light emitting display device) which includes first and second power lines PL1 and PL2 (or signal lines such as scan lines and data lines) or is directly connected to the first and second power lines PL1 and PL2. However, the light emitting device according to the disclosure is not limited to the embodiment illustrated in FIG. 6. For example, in an embodiment, the light emitting device may be electrically connected to the first and/or second power line PL1 and/or PL2 via at least one circuit element (e.g., the pixel circuit PXC of FIGS. 5A to 5C), a connection line, a signal line, or the like.

Referring to FIG. 6, the pixel PXL in accordance with an embodiment may include a first electrode ELT1, a second electrode ELT2, and at least one light emitting diode LD electrically connected between the first and second electrodes ELT1 and ELT2. For example, the pixel PXL may include light emitting diodes LD connected in series and/or parallel to each other between the first and second electrodes ELT1 and ELT2.

Furthermore, the pixel PXL may further include a first contact electrode CNE1 configured to electrically connect the first ends EP1 of the light emitting diodes LD to the first electrode ELT1, and a second contact electrode CNE2 configured to electrically connect the second ends EP2 of the light emitting diodes LD to the second electrode ELT2. The light emitting diodes LD may be electrically connected between the first and second electrodes ELT1 and ELT2 by the first and second contact electrodes CNE1 and CNE2.

The pixel PXL may further include a first connection electrode CNL1 configured to electrically connect the first electrode ELT1 to the first power line PL1, and a second connection electrode CNL2 configured to electrically connect the second electrode ELT2 to the second power line PL2. In an embodiment, the first and second connection electrodes CNL1 and CNL2 may be integral with the first and second electrodes ELT1 and ELT2, respectively, or electrically connected to the first and second electrodes ELT1 and ELT2, respectively, via at least one contact hole or the like. In the case where the first and second connection electrodes CNL1 and CNL2 are integral with the first and second electrodes ELT1 and ELT2, respectively, each of the first and second connection electrodes CNL1 and CNL2 may be regarded as being an area of a corresponding electrode of the first and second electrodes ELT1 and ELT2. In descriptions of embodiments, the first and second connection electrodes CNL1 and CNL2 and the first and second electrodes ELT1 and ELT2 will be described separately from each other to more clearly describe a relative disposition relationship or the like of the first and second electrodes ELT1 and ELT2.

In an embodiment, the first and second electrodes ELT1 and ELT2, the light emitting diodes LD, and/or the first and second contact electrodes CNE1 and CNE2 may form a light emitting device in accordance with an embodiment. For example, the first and second electrodes ELT1 and ELT2, the light emitting diodes LD, and/or the first and second contact electrodes CNE1 and CNE2 may form a light source unit (e.g., the light source unit LSU of FIGS. 5A to 5C) of the pixel PXL in accordance with an embodiment.

In an embodiment, the first electrode ELT1 and the second electrode ELT2 may overlap each other, may have substantially the same width, and may be separated from each other. For example, the first and second electrodes ELT1 and ELT2 may be disposed at positions spaced apart from each other on different layers over the substrate that is a base of the pixel PXL (or the light emitting device), with at least one insulating layer interposed therebetween. For example, the relative disposition relationship of the first and second electrodes ELT1 and ELT2 may be changed in various ways according to embodiments. In an embodiment, the first and second electrodes ELT1 and ELT2 may have substantially the same width at least in an overlapping area thereof. However, the disclosure is not limited thereto. For example, the relative sizes (e.g., widths) of the first and second electrodes ELT1 and ELT2 may be changed in various ways.

In an embodiment, each of the first electrode ELT1 and the second electrode ELT2 may be a pixel electrode, e.g., one of an anode electrode and a cathode electrode. For example, if the first electrode ELT1 may be an anode electrode, the second electrode ELT2 may be a cathode electrode.

In an embodiment, each of the first and second electrodes ELT1 and ELT2 may have a single-layer or multi-layer structure. For example, each first electrode ELT1 may have a multi-layer structure including a first reflective electrode and a first conductive capping layer. Each second electrode ELT2 may have a multi-layer structure including a second reflective electrode and a second conductive capping layer. The material and/or cross-sectional structure of each of the first and second electrodes ELT1 and ELT2 may be changed in various ways according to embodiments, rather than being particularly limited.

In an embodiment, the first electrode ELT1 may be electrically connected to the first power line (e.g., the first power line PL1 of FIGS. 5A to 5C, or a predetermined signal line such as a scan line, a data line, or a control line) through the first connection electrode CNL1. In an embodiment, the first electrode ELT1 and the first connection electrode CNL1 may extend in different directions. For example, in case that the first connection electrode CNL1 extends in the first direction DR1 (e.g., horizontal direction), the first electrode ELT1 may extend in the second direction DR2 (e.g., vertical direction) intersecting the first direction DR1.

In an embodiment, the first electrode ELT1 may be integral with the first connection electrode CNL1. For instance, the first electrode ELT1 may diverge in at least one way from the first connection electrode CNL1. However, the disclosure is not limited thereto. For example, in an embodiment, the first electrode ELT1 and the first connection electrode CNL1 may be individually formed and electrically connected to each other through at least one contact hole, via hole, or the like.

In an embodiment, the first electrode ELT1 and/or the first connection electrode CNL1 may be integral with the first power line PL1 (or first signal line). In an embodiment, the first electrode ELT1 and/or the first connection electrode CNL1 may be formed separately from the first power line PL1 and electrically connected to the first power line PL1 via at least one contact hole and/or at least one circuit element. Therefore, a first power supply voltage (or a first signal such as a scan signal, a data signal, or a control signal) supplied to the first power line PL1 (or first signal line) may be transmitted to the first electrode ELT1.

In an embodiment, the second electrode ELT2 may be electrically connected to the second power line PL2 (or a predetermined second signal line such as a scan line, a data line, or a control line) through the second connection electrode CNL2. In an embodiment, the second electrode ELT2 and the second connection electrode CNL2 may extend in different directions. For example, in case that the second connection electrode CNL2 extends in the first direction DR1, the second electrode ELT2 may extend in the second direction DR2 intersecting the first direction DR1.

In an embodiment, the second electrode ELT2 may be integral with the second connection electrode CNL2. For instance, the second electrode ELT2 may diverge in at least one way from the second connection electrode CNL2. However, the disclosure is not limited thereto. For example, in an embodiment, the second electrode ELT2 and the second connection electrode CNL2 may be separately formed and electrically connected to each other through at least one contact hole, via hole, or the like.

In an embodiment, the second electrode ELT2 and/or the second connection electrode CNL2 may be integral with the second power line (e.g., the second power line PL2 of FIGS. 5A to 5C, or a second signal line). In an embodiment, the second electrode ELT2 and/or the second connection electrode CNL2 may be formed separately from the second power line PL2 and electrically connected to the second power line PL2 via at least one contact hole and/or at least one circuit element. Therefore, a second power supply voltage (or a second signal such as a scan signal, a data signal, or a control signal) supplied to the second power line PL2 (or the second signal line) may be transmitted to the second electrode ELT2.

In an embodiment, the first power supply (e.g., the first power supply VDD of FIGS. 5A to 5C) and the second power supply (e.g., the second power supply VSS of FIGS. 5A to 5C) may have different potentials. For example, a difference in potential between the first power supply VDD and the second power supply VSS may be equal to or greater than a threshold voltage of the light emitting diodes LD. In an embodiment, the first power supply VDD and the second power supply VSS may have potentials enabling at least one light emitting diode LD to be connected in a forward direction between the first and second electrodes ELT1 and ELT2. In other words, the voltage between the first power supply VDD and the second power supply VSS may have a value enabling at least one light emitting diode LD included in the pixel PXL (or light emitting device) to emit light.

In an embodiment, each light emitting diode LD may be a rod-type light emitting diode which is disposed adjacent to the first and second electrodes ELT1 and ELT2 and includes a first end EP1 and a second end EP2 disposed on opposite ends thereof in a longitudinal direction. For example, each light emitting diode LD may be a subminiature rod-type light emitting diode which has a diameter D and/or a length L ranging from the nanoscale to the microscale, as illustrated in FIGS. 1A to 3B. However, the shape and/or size of the light emitting diode LD may be changed in various ways according to design conditions, etc. of each light emitting device, e.g., the pixel PXL.

In an embodiment, the first end EP1 of at least one light emitting diode LD may be disposed on an end facing toward an area of the first and second electrode ELT1 and ELT2 (e.g., an overlapping area of the first and second electrodes ELT1 and ELT2), and the second end EP2 of the light emitting diode LD may be disposed on an end opposite to the first end EP1. For example, at least one light emitting diode LD may be horizontally oriented in a direction (e.g., first direction DR1) intersecting an extension direction of the first and second electrodes ELT1 and ELT2 (e.g., second direction DR2). The first end EP1 of the light emitting diode LD may be adjacent to the first and second electrodes ELT1 and ELT2.

Although FIG. 6 illustrates that the light emitting diodes LD are uniformly oriented in a direction, e.g., the first direction DR1, the disclosure is not limited thereto. For example, at least one of the light emitting diodes LD may be oriented in a diagonal direction inclined with respect to the first and second directions DR1 and DR2.

In an embodiment, light emitting diodes LD may be connected in parallel between the first electrode ELT1 and the second electrode ELT2. For example, the first ends EP1 of the light emitting diodes LD may be directly or indirectly connected to the first electrode ELT1. The second ends EP2 of the light emitting diodes LD may be directly or indirectly connected to the second electrode ELT2.

For example, in an embodiment, the first ends EP1 of the light emitting diodes LD may be electrically connected to the first electrode ELT1 via the first contact electrode CNE1. The second ends EP2 of the light emitting diodes LD may be electrically connected to the second electrode ELT2 via the second contact electrode CNE2. In an embodiment, at least one of the first and second ends EP1 and EP2 of each light emitting diode LD may directly contact the first and/or second electrodes ELT1 and/or ELT2 and may be electrically connected to the first and/or second electrodes ELT1 and/or ELT2.

In an embodiment, the light emitting diodes LD may be prepared in a diffused or dispersed form in a predetermined solution, and then supplied by an inkjet printing method or the like to a predetermined emission area (e.g., the emission area of each pixel PXL) defined in the light emitting device. For example, the light emitting diodes LD may be mixed with a volatile solvent and supplied to each emission area. Here, if predetermined first and second alignment voltages are respectively applied to the first and second electrodes ELT1 and ELT2 through the first and second power lines PL1 and PL2, an electric field may be formed between the first and second electrodes ELT1 and ELT2. Therefore, the light emitting diodes LD may be aligned. After the light emitting diodes LD have been aligned, the solvent may be removed by a volatilization method or other methods. In this way, the light emitting diodes LD may be reliably arranged between the first and second electrodes ELT1 and ELT2. Furthermore, after the light emitting diodes LD have been arranged, the first contact electrode CNE1 and the second contact electrode CNE2 may be respectively formed on the opposite ends of the light emitting diodes LD, i.e., the first and second ends EP1 and EP2. Therefore, the light emitting diodes LD may be more reliably connected between the first and second electrodes ELT1 and ELT2.

In an embodiment, the first contact electrode CNE1 may be disposed on the first ends EP1 of the light emitting diodes LD and an area of the first and second electrode ELT1 and ELT2 (e.g., the overlapping area of the first and second electrodes ELT1 and ELT2) so that the first ends EP1 of the light emitting diodes LD can be electrically connected with the first electrode ELT1. The second contact electrode CNE2 may be disposed on the second ends EP2 of the light emitting diodes LD and may be electrically connected to the second electrode ELT2 through at least one contact hole CH0 and/or the second connection electrode CNL2. The second ends EP2 of the light emitting diodes LD may be electrically connected to the second electrode ELT2 by the second contact electrode CNE2.

In case that the voltage of the first power supply VDD (or, a first signal) is applied to the first ends EP1 of the light emitting diodes LD via the first power line PL1, the first electrode ELT1, or the like and the voltage of the second power supply VS S (or second signal) is applied to the second ends EP2 of the light emitting diodes LD via the second power line PL2, the second electrode ELT2, or the like, at least one light emitting diode LD that electrically connected in the forward direction between the first and second electrodes ELT1 and ELT2 may emit light. Therefore, the pixel PXL may emit light.

Figure 7:
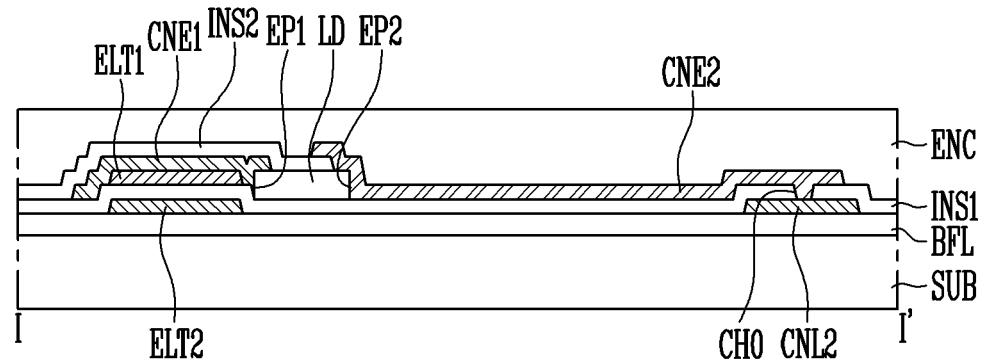
FIG. 7 is a cross-sectional view illustrating a light emitting device in accordance with an embodiment of the disclosure and for example illustrates an embodiment of a cross-section corresponding to line I-I' of FIG. 6.

FIG. 7 is a cross-sectional view illustrating a light emitting device in accordance with an embodiment, and FIG. 7 illustrates, for example, an embodiment of a cross-section taken along line I-I' of FIG. 6. In an embodiment, the light emitting device of FIG. 7 may correspond to a passive pixel PXL, but the light emitting device in accordance with the disclosure is not limited to only the pixel PXL.

Referring to FIGS. 6 and 7, the pixel PXL (or the light emitting device) in accordance with an embodiment may include a substrate SUB, a buffer layer BFL, a second electrode ELT2, a second connection electrode CNL2, a first insulating layer INS1, a first electrode ELT1, a first connection electrode CNL1, at least one light emitting diode LD (e.g., light emitting diodes LD), a first contact electrode CNE1, a second insulating layer INS2, a second contact electrode CNE2, and an encapsulation layer ENC which are successively disposed on a surface of the substrate SUB. For example, in an embodiment, based on a surface of the substrate SUB, the buffer layer BFL may be disposed on a first layer, the second electrode ELT2 and the second connection electrode CNL2 may be disposed on a second layer, the first insulating layer INS1 may be provided on a third layer, the first electrode ELT1 and the first connection electrode CNL1 may be disposed on a fourth layer, the light emitting diode LD may be disposed on a fifth layer, the first contact electrode CNE1 may be disposed on a sixth layer, the second insulating layer INS2 may be disposed on a seventh layer, the second contact electrode CNE2 may be disposed on an eighth layer, and the encapsulation layer ENC may be disposed on a ninth layer. Here, the above-defined respective positions of the components on the layers may be based on a relative arrangement relationship between the components disposed on the substrate SUB and/or on a sequence of forming or supplying the components, and may not be based on distances, heights, or the like from the substrate SUB.

Furthermore, in some embodiments, at least one of the foregoing components may be omitted, or the position of the at least one may be changed. For example, the positions of the first electrode ELT1 and the first connection electrode CNL1 disposed on layers may be switched with those of the second electrode ELT2 and the second connection electrode CNL2. For example, in an embodiment, the first electrode ELT1 and the first connection electrode CNL1 may be disposed on the second layer of the substrate SUB, and the second electrode ELT2 and the second connection electrode CNL2 may be disposed on the fourth layer of the substrate SUB. Likewise, the positions of the first contact electrode CNE1 and the second contact electrode CNE2 on the layers may be switched with each other. Furthermore, in an embodiment, at least one of the components illustrated in FIG. 7 may be selectively omitted, or additional components may be provided in each pixel PXL.

The substrate SUB may form a base of the display panel (e.g., the display panel PNL of FIG. 4) including the pixel PXL and may be a rigid substrate or a flexible substrate. Furthermore, the substrate SUB may be a transparent substrate, but the disclosure is not limited thereto. In other words, in the disclosure, the material or properties of the substrate SUB are not particularly limited. The buffer layer BFL may be disposed on a surface of the substrate SUB.

The buffer layer BFL may prevent impurities from diffusing into electrodes, lines, and/or circuit elements that are disposed on the buffer layer BFL. In an embodiment, the buffer layer BFL may be formed of a single layer or may be formed of multiple layers having at least two layers. In the case where the buffer layer BFL has a multilayer structure, the respective layers may be formed of the same material or different materials. In an embodiment, the buffer layer BFL may be omitted. The buffer layer BFL may be selectively formed on the surface of the substrate SUB.

The second electrode ELT2 and the second connection electrode CNL2 may be disposed on the surface of the substrate SUB on which the buffer layer BFL is formed. In an embodiment, the second electrode ELT2 and the second connection electrode CNL2 may extend in different directions. Furthermore, the second electrode ELT2 and the second connection electrode CNL2 may be integral with each other or non-integrally connected with each other.

In an embodiment, the second electrode ELT2 and the second connection electrode CNL2 may include various conductive materials. For example, the second electrode ELT2 and the second connection electrode CNL2 may have at least one reflective electrode layer, but the disclosure is not limited thereto.

For example, the second electrode ELT2 and/or the second connection electrode CNL2 may include conductive material having a predetermined reflectivity. For example, the second electrode ELT2 and/or the second connection electrode CNL2 may include at least one of metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), and a conductive polymer such as PEDOT, but the disclosure is not limited thereto. In other words, the materials of the second electrode ELT2 and the second connection electrode CNL2 are not particularly limited, and the second electrode ELT2 and the second connection electrode CNL2 may have various known electrode materials.

Furthermore, each of the second electrode ELT2 and the second connection electrode CNL2 may be formed of a single layer or multiple layers, and a cross-sectional structure (e.g., stacked structure) thereof is not particularly limited. For example, the second electrode ELT2 may have a multi-layer structure including at least one reflective electrode layer and at least one conductive capping layer. Furthermore, the second electrode ELT2 may selectively further include at least one transparent electrode layer. In an embodiment, the second connection electrode CNL2 and the second electrode ELT2 may have the same cross-sectional structure, but the disclosure is not limited thereto.

In an embodiment, the second electrode ELT2 and/or the second connection electrode CNL2 may include at least one reflective electrode layer, at least one transparent electrode layer disposed over and/or under the reflective electrode layer, and at least one conductive capping layer configured to cover or overlap an upper portion of the reflective electrode layer and/or the transparent electrode layer. In an embodiment, the reflective electrode layer may be formed of various conductive materials, e.g., Ag, having reflectivity, and the material thereof is not particularly limited. In the case where the second electrode ELT2 and/or the second connection electrode CNL2 includes a reflective electrode layer, light emitted from the opposite ends of each of the light emitting diodes LD, i.e., the first and second ends EP1 and EP2, may travel in a direction (e.g., in a frontal direction) in which an image is displayed.

Furthermore, if the second electrode ELT2 and/or the second connection electrode CNL2 has a multi-layer structure including at least one transparent electrode layer disposed over and/or under the reflective electrode layer, a voltage drop due to a signal delay (RC delay) may be reduced or minimized. Thus, a desired voltage can be effectively transmitted to the light emitting diodes LD. In an embodiment, the transparent electrode layer may be formed of various transparent conductive materials including ITO, and the material thereof is not particularly limited.

If the second electrode ELT2 and/or the second connection electrode CNL2 includes a conductive capping layer overlapping the reflective electrode layer and/or the transparent electrode layer, it is possible to prevent the reflective electrode layer or the like of the second electrode ELT2 and/or the second connection electrode CNL2 from being damaged because of defects caused during the process of manufacturing the pixel PXL. However, the conductive capping layer may be selectively included in the second electrode ELT2 and/or the second connection electrode CNL2 and may be omitted in some embodiments. The conductive capping layer may be regarded as a component of the second electrode ELT2 and/or the second connection electrode CNL2 or regarded as a separate component disposed on the second electrode ELT2 and/or the second connection electrode CNL2.

The first insulating layer INS1 may be disposed on the substrate SUB on which the second electrode ELT2 and the second connection electrode CNL2 are formed. For example, the first insulating layer INS1 may be disposed on the substrate SUB to overlap the second electrode ELT2 and the second connection electrode CNL2.

The first insulating layer INS1 may have a single- or multi-layer structure including at least one organic layer and/or inorganic layer and include various known insulating materials. For example, the first insulating layer INS1 may include at least one inorganic layer formed of $SiN_x$, but the disclosure is not limited thereto.

In an embodiment, the first insulating layer INS1 may include a contact hole CH0 which exposes an area of the second connection electrode CNL2. For example, the first insulating layer INS1 may include at least one contact hole CH0 in the overlapping area of the second connection electrode CNL2 and the second contact electrode CNE2.

The first electrode ELT1 and the first connection electrode CNL1 may be disposed on the substrate SUB on which the first insulating layer INS1 is formed. In an embodiment, the first electrode ELT1 may be disposed to overlap the second electrode ELT2 with the first insulating layer INS1 interposed therebetween. In other words, areas of the first and second electrodes ELT1 and ELT2 may overlap each other and may be spaced apart from each other with at least the first insulating layer INS1 interposed therebetween.

In an embodiment, the first electrode ELT1 and the first connection electrode CNL1 may extend in different directions. Furthermore, the first electrode ELT1 and the first connection electrode CNL1 may be integral with each other or non-integrally connected with each other.

In an embodiment, the first electrode ELT1 and the first connection electrode CNL1 may include various conductive materials. For example, the first electrode ELT1 and the first connection electrode CNL1 may include at least one reflective electrode layer, but the disclosure is not limited thereto.

For example, the first electrode ELT1 and/or the first connection electrode CNL1 may include conductive material having a predetermined reflectivity. For example, the first electrode ELT1 and/or the first connection electrode CNL1 may include at least one of metal such as Ag, Mg, Al, Pt, Pd, Au, Ni, Nd, Ir, Cr, or an alloy thereof, a conductive oxide such as indium tin oxide (ITO), indium zinc oxide (IZO), zinc oxide (ZnO), or indium tin zinc oxide (ITZO), and a conductive polymer such as PEDOT, but the disclosure is not limited thereto. In other words, the material of the first electrode ELT1 and the first connection electrode CNL1 is not particularly limited, and the first electrode ELT1 and the first connection electrode CNL1 may have various known electrode materials. Furthermore, the first electrode ELT1 and/or the first connection electrode CNL1 and the second electrode ELT2 and/or the second connection electrode CNL2 may include the same conductive material or different conductive materials.

Furthermore, each of the first electrode ELT1 and the first connection electrode CNL1 may be formed of (or include) a single layer or multiple layers, and a cross-sectional structure (e.g., a stacked structure) thereof is not particularly limited. For example, the first electrode ELT1 may have a multi-layer structure including at least one reflective electrode layer and at least one conductive capping layer. Furthermore, the first electrode ELT1 may selectively further include at least one transparent electrode layer. In an embodiment, the first connection electrode CNL1 and the first electrode ELT1 may have the same cross-sectional structure, but the disclosure is not limited thereto.

In an embodiment, the first electrode ELT1 and/or the first connection electrode CNL1 may include at least one reflective electrode layer, at least one transparent electrode layer disposed over and/or under the reflective electrode layer, and at least one conductive capping layer configured to cover or overlap an upper portion of the reflective electrode layer and/or the transparent electrode layer. In an embodiment, the reflective electrode layer may be formed of various conductive materials, e.g., Ag, having reflectivity, and the material thereof is not particularly limited. In the case where the first electrode ELT1 and/or the first connection electrode CNL1 includes a reflective electrode layer, light emitted from the opposite ends of each of the light emitting diodes LD, i.e., the first and second ends EP1 and EP2, may travel in a direction (e.g., in a frontal direction) in which an image is displayed.

Furthermore, if the first electrode ELT1 and/or the first connection electrode CNL1 has a multi-layer structure including at least one transparent electrode layer disposed over and/or under the reflective electrode layer, a voltage drop due to a signal delay may be reduced or minimized. Therefore, a desired voltage can be effectively transmitted to the light emitting diodes LD. In an embodiment, the transparent electrode layer may be formed of various transparent conductive materials including ITO, and the material thereof is not particularly limited.

If the first electrode ELT1 and/or the first connection electrode CNL1 includes a conductive capping layer overlapping the reflective electrode layer and/or the transparent electrode layer, it is possible to prevent the reflective electrode layer or the like of the first electrode ELT1 and/or the first connection electrode CNL1 from being damaged because of defects caused during the process of manufacturing the pixel PXL. However, the conductive capping layer may be selectively included in the first electrode ELT1 and/or the first connection electrode CNL1 and may be omitted in some embodiments. The conductive capping layer may be regarded as a component of the first electrode ELT1 and/or the first connection electrode CNL1, or regarded as a separate component disposed on the first electrode ELT1 and/or the first connection electrode CNL1.

At least one light emitting diode LD may be disposed on the substrate SUB on which the first electrode ELT1 and the first connection electrode CNL1 are formed. For example, light emitting diodes LD may be disposed in each pixel area in which each pixel PXL is formed.

In an embodiment, the first end EP1 of each of the light emitting diodes LD may be disposed adjacent to the first and second electrodes ELT1 and ELT2. For example, the first end EP1 of each of the light emitting diodes LD may be disposed adjacent an edge (e.g., a left or right edge) of the first electrode ELT1. The second end EP2 of each of the light emitting diodes LD may be disposed on a side opposite to the first end EP1.

The first contact electrode CNE1 may be disposed on the substrate SUB on which the light emitting diodes LD are disposed. In an embodiment, the first contact electrode CNE1 may be disposed to overlap an area of the first and second electrodes ELT1 and ELT2 and the first ends EP1 of the light emitting diodes LD. In some embodiments, the first contact electrode CNE1 may be directly formed on the first electrode ELT1 such that the first contact electrode CNE1 electrically contact the first electrode ELT1 and the first ends EP1 of the light emitting diodes LD, but the disclosure is not limited thereto. For example, in an embodiment, at least one insulating layer may be interposed between the first electrode ELT1 and the first contact electrode CNE1. The first electrode ELT1 and the first contact electrode CNE1 may be connected to each other by a contact hole (or opening) or the like that is formed in the insulating layer. The first contact electrode CNE1 may stably support the first ends EP1 of the light emitting diodes LD and electrically connect the first ends EP1 to the first electrode ELT1.

In an embodiment, the first contact electrode CNE1 may be substantially transparent or translucent. For example, the first contact electrode CNE1 may be formed of transparent conductive material including ITO or IZO and may also be made of (or include) various known transparent conductive materials. Therefore, light generated from each light emitting diode LD may be emitted out of the light emitting diode LD through the first contact electrode CNE1.

The second insulating layer INS2 may be disposed on the substrate SUB on which the first contact electrode CNE1 is formed. For example, the second insulating layer INS2 may be disposed on the first contact electrode CNE1 to cover at least the first contact electrode CNE1. An end of the second insulating layer INS2 may be interposed between the first contact electrode CNE1 and the second contact electrode CNE2. Therefore, the first contact electrode CNE1 and the second contact electrode CNE2 may be reliably separated from each other, so that electrical stability between the first contact electrode CNE1 and the second contact electrode CNE2 may be secured. In other words, a short-circuit defect between the first contact electrode CNE1 and the second contact electrode CNE2 may be prevented by the second insulating layer INS2.

In an embodiment, the second insulating layer INS2 may have a single- or multi-layer structure including at least one organic layer and/or at least one inorganic layer and include various known insulating materials. For example, the second insulating layer INS2 may include at least one inorganic layer formed of $SiN_x$, but the disclosure is not limited thereto. Furthermore, the second insulating layer INS2 and the first insulating layer INS1 may include the same insulating material or different insulating materials.

The second contact electrode CNE2 may be disposed on the substrate SUB on which the second insulating layer INS2 is formed. In an embodiment, the second contact electrode CNE2 may be disposed to overlap the second ends EP2 of the light emitting diodes LD and an area of the second connection electrode CNL2.

For example, the second contact electrode CNE2 may be disposed on the second ends EP2 of the light emitting diodes LD such that the second contact electrode CNE2 directly contacts the second ends EP2. The second contact electrode CNE2 may be disposed to overlap an area of the second connection electrode CNL2 and thus be electrically connected to the second connection electrode CNL2 and the second electrode ELT2 by at least one contact hole CH0 passing through the first insulating layer INS1. The second contact electrode CNE2 may stably support the second ends EP2 of the light emitting diodes LD and electrically connect the second ends EP2 to the second electrode ELT2.

In an embodiment, the second contact electrode CNE2 may be substantially transparent or translucent. For example, the second contact electrode CNE2 may be formed of transparent conductive material including ITO or IZO and may also be made of (or include) various known transparent conductive materials. Therefore, light generated from each light emitting diode LD may be emitted out of the light emitting diode LD through the second contact electrode CNE2. Furthermore, the second contact electrode CNE2 and the first contact electrode CNE1 may include the same conductive material or different conductive materials.

At least one insulating layer may be disposed on the substrate SUB on which the first and second contact electrodes CNE1 and CNE2 are formed. For example, a surface of the substrate SUB on which the first and second contact electrodes CNE1 and CNE2 are formed may be overlapped by at least one insulating layer. In an embodiment, the at least one insulating layer may include an encapsulation layer ENC (or overcoat layer).

The encapsulation layer ENC may be formed of a single layer or multiple layers. For example, the encapsulation layer ENC may be a thin film encapsulation layer which includes inorganic insulating layers overlapping each other and at least one organic insulating layer interposed between the inorganic insulating layers. However, the material and/or cross-sectional structure of the encapsulation layer ENC is not particularly limited and may be changed in various ways. In an embodiment, the encapsulation layer ENC may be formed to overlap at least a display area (e.g., the display area DA of FIG. 4) and thus protect the pixels PXL. In an embodiment, not only the encapsulation layer ENC but also at least one passivation layer, optical layer, or the like may be selectively further disposed on the surface of the substrate SUB on which the light emitting diodes LD or the like are disposed.

In the above-mentioned embodiment(s) of FIGS. 6 and 7, the first electrode ELT1 and the second electrode ELT2 may overlap each other on different layers over the substrate SUB. For example, the first electrode ELT1 and the second electrode ELT2 may be disposed on different layers separated from each other with the first insulating layer INS1 interposed therebetween. As such, if the first electrode ELT1 and the second electrode ELT2 are separately disposed on different layers, a short-circuit defect between the first electrode ELT1 and the second electrode ELT2 may be effectively prevented from occurring in the step of fabricating the pixel PXL (or light emitting device).

Furthermore, as described in the foregoing embodiment, if the first electrode ELT1 and the second electrode ELT2 are separately disposed on different layers, the distance between the first electrode ELT1 and the second electrode ELT2 which may be set taking into account a process margin or the like may be further reduced, compared to that of pixels of other embodiments (or light emitting devices of other embodiments) in which the first electrode ELT1 and the second electrode ELT2 are formed on the same layer. For example, in case that an embodiment is used, the distance between the first electrode ELT1 and the second electrode ELT2 may be reduced to be less than about 2.5 μm. If the distance between the first electrode ELT1 and the second electrode ELT2 is reduced, the magnitude of the electric field formed between the first electrode ELT1 and the second electrode ELT2 may be further increased even in case that the voltages applied to the first electrode ELT1 and the second electrode ELT2 are the same as that of the existing case. Furthermore, the magnitude of the electric field formed between the first electrode ELT1 and the second electrode ELT2 may be easily controlled by adjusting the thickness of the first insulating layer INS1. Therefore, the light emitting diode LD may be efficiently aligned between the first electrode ELT1 and the second electrode ELT2, and the quality of the alignment can be enhanced. In other words, according to the foregoing embodiment, a short-circuit defect between the first electrode ELT1 and the second electrode ELT2 may be effectively prevented or mitigated, and at least one light emitting diode LD may be efficiently and stably arranged between the first electrode ELT1 and the second electrode ELT2.

The electric field formed between the first and second electrodes ELT1 and ELT2 may have the maximum magnitude in edge areas of the first and second electrode ELT1 and ELT2 (e.g., in a plan view, opposite edges of the first and second electrodes ELT1 and ELT2), so that the light emitting diodes LD may be effectively arranged on opposite sides of the first and second electrodes ELT1 and ELT2. According to the foregoing embodiments, even if a size deviation (e.g., a width deviation) of the first and second electrodes ELT1 and ELT2 occurs due to a process error or the like, a biased alignment phenomenon in which the light emitting diodes LD are biased toward only one electrode may be prevented.

Figure 8:
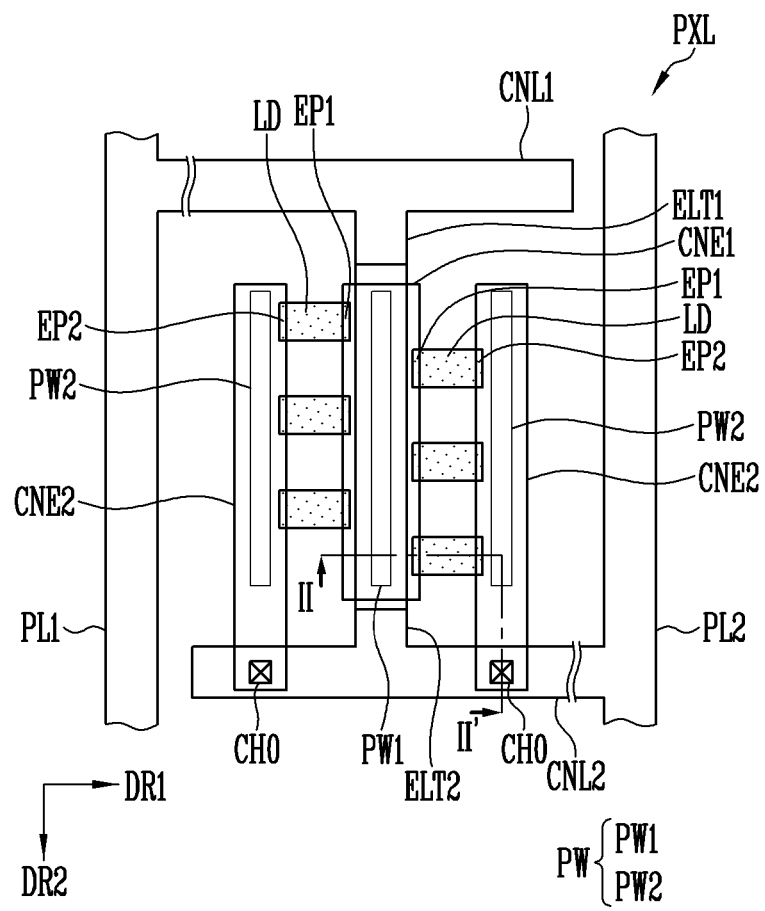
FIG. 8 is a plan view schematically illustrating a light emitting device in accordance with an embodiment of the disclosure, and for example illustrates an example of a pixel formed of the light emitting device.
Figure 9A:
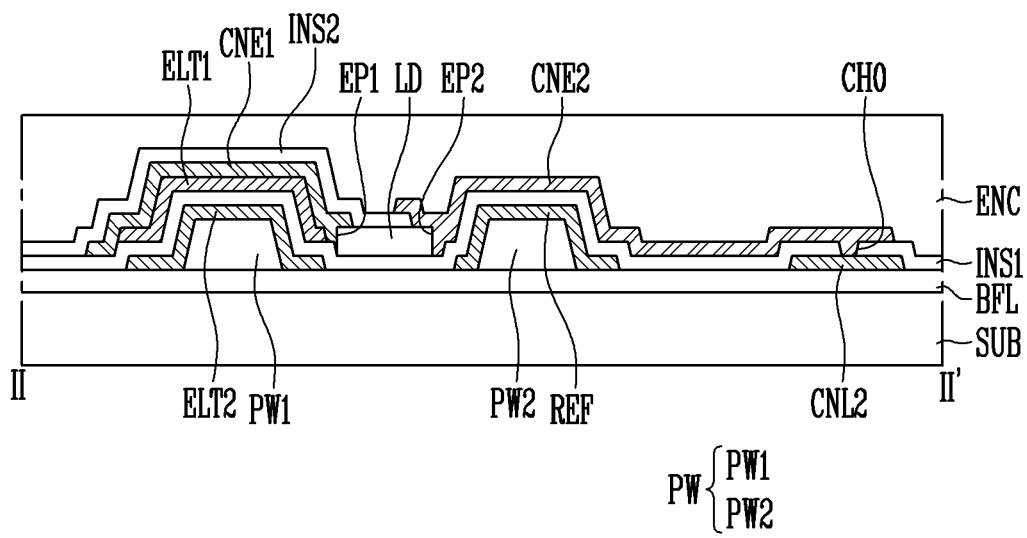
FIGS. 9A and 9B are cross-sectional views schematically illustrating a light emitting device in accordance with an embodiment of the disclosure, and for example illustrate different embodiments of a cross-section corresponding to line II-II' of FIG. 8.
Figure 9B:
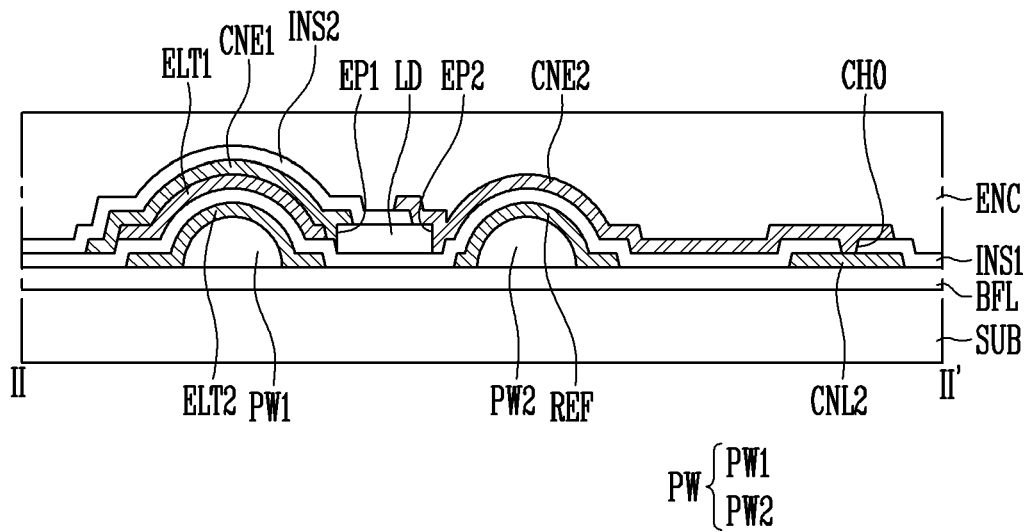

FIG. 8 is a plan view schematically illustrating a light emitting device in accordance with an embodiment, and for example, illustrates an example of a pixel PXL including the light emitting device. FIGS. 9A and 9B each are a cross-section view schematically illustrating a light emitting device in accordance with an embodiment, and for example illustrate different embodiments of a cross-section taken along line II-II' of FIG. 8. For example, FIGS. 9A and 9B illustrate embodiments showing different shapes of the partition wall PW. In an embodiment of FIGS. 8 to 9B, like reference numerals are used to denote identical or similar components to those of the embodiment(s) of FIGS. 6 to 7, and detailed descriptions thereof will be omitted.

Referring to FIGS. 8 to 9B, the pixel PXL (or light emitting device) may further include at least one partition wall PW. For example, the pixel PXL may include a first partition wall PW (or referred to as a "first wall" or "first bank") disposed under the first and second electrodes ELT1 and ELT2, and at least one second partition wall PW2 (or referred to as a "second wall" or "second bank") disposed under each second contact electrode CNE2. Furthermore, the pixel PXL may selectively further include a reflective layer REF over each second partition wall PW2.

In an embodiment, the first and second partition walls PW1 and PW2 may be disposed on the buffer layer BFL at positions spaced apart from each other. In the case where the buffer layer BFL or the like is omitted, the first and second partition walls PW1 and PW2 may be directly formed on a surface of the substrate SUB. However, the disclosure is not limited thereto, and the positions of the first and second partition walls PW1 and PW2 disposed on the layers may be changed in various ways.

In an embodiment, the first and second partition walls PW1 and PW2 may be disposed on the same layer on the substrate SUB at positions spaced apart from each other by a predetermined distance (or predetermined interval). Furthermore, the first and second partition walls PW1 and PW2 may have substantially the same structure, shape, and/or height, but the disclosure is not limited thereto.

In an embodiment, the first partition wall PW1 may be disposed between the substrate SUB and the first and second electrodes ELT1 and ELT2. In an embodiment, the first partition wall PW1 may be disposed between the second electrode ELT2 and the substrate SUB on which the buffer layer BFL is formed. The first partition wall PW1 may be disposed adjacent to the first end EP1 of at least one light emitting diode LD. For example, a side surface of the first partition wall PW1 may be positioned adjacent to the first end EP1 of the at least one light emitting diode LD and disposed to face the first end EP1.

In an embodiment, the second partition wall PW2 may be disposed between the substrate SUB and the second contact electrode CNE2. For example, the second partition wall PW2 may be disposed between the first insulating layer INS1 and the substrate SUB on which the buffer layer BFL is formed. The reflective layer REF may be selectively disposed over the second partition wall PW2. The second partition wall PW2 may be disposed adjacent to the second end EP2 of at least one light emitting diode LD. For example, a side surface of the second partition wall PW2 may be positioned adjacent to the second end EP2 of the at least one light emitting diode LD and disposed to face the second end EP2. Furthermore, at least one reflective layer REF may be further disposed between the second partition wall PW2 and the second contact electrode CNE2. In an embodiment, in a processing step of forming the second electrode ELT2, the reflective layer REF and the second electrode ELT2 (for example, the reflective electrode layer of the second electrode ELT2) may be simultaneously formed of the same material, but the disclosure is not limited thereto.

The partition wall PW may have various shapes. For example, each partition wall PW may have a trapezoidal cross-section, the width of which reduces upward, as illustrated in FIG. 9A. In this case, each partition wall PW may have an inclined surface on at least one side surface. In an embodiment, as illustrated in FIG. 9B, each partition wall PW may have a semi-circular or semi-elliptical cross-section, the width of which gradually reduces upward. In this case, each partition wall PW may have a curved surface on at least one side surface. In other words, in the disclosure, the shape of the partition walls PW is not particularly limited and may be changed in various ways. In an embodiment, at least one of the partition walls PW (e.g., the first and/or second partition walls PW1 and/or PW2) of the partition walls PW may be omitted, or the position thereof may be changed.

In an embodiment, each partition wall PW may include insulating material including an inorganic material or organic material. Furthermore, each partition wall PW may be formed of a single layer or multiple layers. In other words, in the disclosure, the material and/or the stacked structure of the partition walls PW is not particularly limited and may be changed in various ways.

In an embodiment, each partition wall PW may also function as a reflective component. For example, each partition wall PW, along with the reflective layer REF and/or the first and second electrodes ELT1 and ELT2 provided on the partition wall PW, may function as a reflective component for enhancing the efficiency of light emitted from each light emitting diode LD.

The first and second electrodes ELT1 and ELT2 or the like may be successively disposed over the first partition wall PW1. The reflective layer REF or the like may be disposed over the second partition wall PW2. In an embodiment, at least a portion of the first and second electrodes ELT1 and ELT2 and the reflective layer REF that are respectively disposed over the first and second partition walls PW1 and PW2 may have shapes corresponding to the shapes of the first and second partition walls PW1 and PW2, respectively. For example, the first and second electrodes ELT1 and ELT2 and the reflective layer REF may have shapes corresponding to the partition walls PW, respectively, and may protrude in a height-wise direction of the substrate SUB.

If as described above, the first and second electrodes ELT1 and ELT2 and the reflective layer REF have shapes corresponding to the respective partition walls PW, light emitted from the first and second ends EP1 and EP2 of the light emitting diodes LD may be reflected by the first and second electrodes ELT1 and ELT2, the reflective layer REF or the like and may thus more effectively travel in the frontal direction of the light emitting device. Therefore, the efficiency of light emitted from the light emitting diodes LD may be enhanced.

Figure 10:
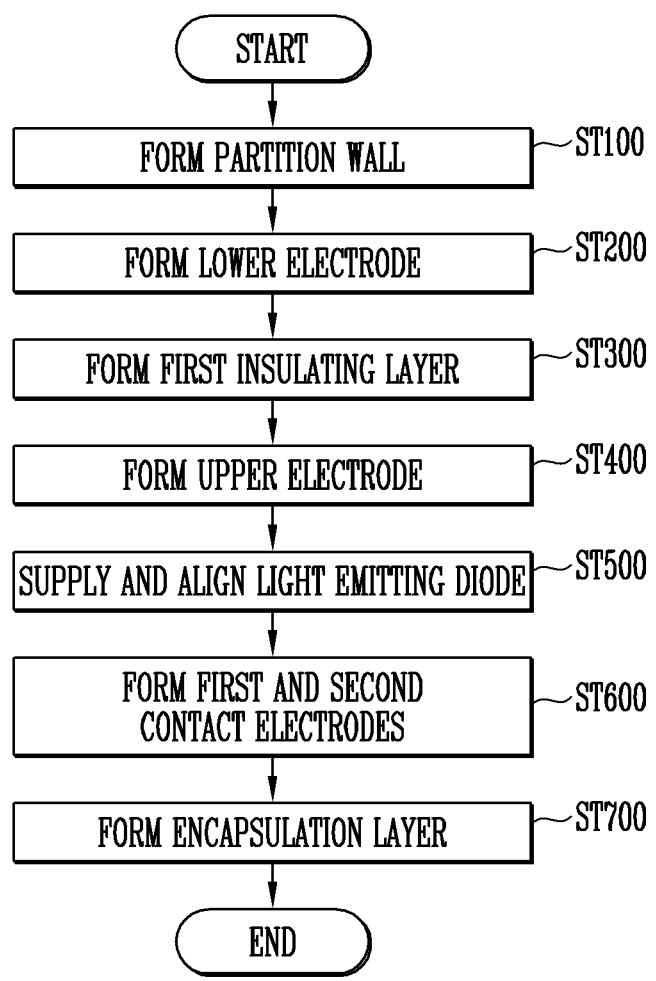
FIG. 10 is a flowchart schematically illustrating a method of fabricating a light emitting device in accordance with an embodiment of the disclosure, and for example illustrates an embodiment of a method of fabricating the light emitting device according to an embodiment of FIGS. 8 to 9B.

FIG. 10 is a flowchart schematically illustrating a method of fabricating a light emitting device in accordance with an embodiment, and for example, illustrates an embodiment of a method of fabricating the light emitting device according to the embodiment(s) of FIGS. 8 to 9B. Hereinafter, the method of fabricating the light emitting device (e.g., the pixel PXL including the light emitting device) in accordance with an embodiment will be described with reference to FIGS. 8 to 10.

<ST100: The Step of Forming the Partition Wall>

First, at least one partition wall PW may be formed on a surface of the substrate SUB or on the buffer layer BFL disposed on the surface of the substrate SUB. For example, the first and second partition walls PW1 and PW2 may be formed at positions spaced apart from each other in each emission area (e.g., the emission area of each pixel PXL) defined on the substrate SUB.

Although in FIGS. 8 to 10 there is disclosed an embodiment where the partition wall PW is directly formed on the substrate SUB or the buffer layer BFL, the disclosure is not limited thereto. For example, in an embodiment, a circuit element layer which is not shown may be formed on the substrate SUB or the buffer layer BFL, and the first and second partition walls PW1 and PW2, the first and second electrodes ELT1 and ELT2, the light emitting diodes LD, and/or the first and second contact electrodes CNE1 and CNE2 may be formed on the circuit element layer. In this case, a process of forming the circuit element layer may be performed before the partition wall PW is formed. In the case where the partition wall PW is omitted as described in the embodiment(s) of FIGS. 6 and 7, the forming of the partition wall PW may be omitted.

<ST200: The Step of Forming the Lower Electrode>

Subsequently, the lower electrode may be formed on the substrate SUB on which the buffer layer BFL and/or the partition wall PW are formed. For example, the second electrode ELT2 and the second connection electrode CNL2 may be formed on the substrate SUB. Furthermore, in an embodiment, the reflective layer REF or the like may be further formed along with the second electrode ELT2 and the second connection electrode CNL2.

<ST300: The Step of Forming the First Insulating Layer>

Subsequently, the first insulating layer INS1 may be formed on the substrate SUB on which the second electrode ELT2 and the second connection electrode CNL2 are formed. For example, the first insulating layer INS1 may be formed on the substrate SUB to overlap at least the second electrode ELT2.

<ST400: The Step of Forming the Upper Electrode>

Thereafter, the upper electrode may be formed on the substrate SUB on which the first insulating layer INS1 is formed. For example, the first electrode ELT1 and the first connection electrode CNL1 may be formed on the substrate SUB. In an embodiment, the first electrode ELT1 may be formed on the first insulating layer INS1 such that the first electrode ELT1 overlaps the second electrode ELT2, but the disclosure is not limited thereto.

<ST500: The Step of Supplying and Aligning a Light Emitting Diode>

Subsequently, at least one light emitting diode LD may be supplied on the substrate SUB on which the first electrode ELT1 and the first connection electrode CNL1 are formed, and the light emitting diode LD may be aligned such that an end of the light emitting diode LD is adjacent to the upper electrode (e.g., the first electrode ELT1). For example, light emitting diodes LD may be supplied onto the substrate SUB by an inkjet printing method or the like, and predetermined alignment voltages are applied to the first and second electrodes ELT1 and ELT2, whereby the light emitting diodes LD can be aligned.

<ST600: The Step of Forming the First and Second Contact Electrodes>

Thereafter, the light emitting diodes LD may be electrically connected between lower electrode (e.g., the second electrode ELT2) and the upper electrode (e.g., the first electrode ELT1) by forming the first and second contact electrodes CNE1 and CNE2 on the substrate SUB on which the light emitting diodes LD are aligned. For example, the light emitting diodes LD may be electrically connected between the first electrode ELT1 and the second electrode ELT2 by forming the first contact electrode CNE1 configured to electrically connect the first ends EP1 of the light emitting diodes LD to the first electrode ELT1, and by forming the second contact electrode CNE2 configured to electrically connect the second ends EP2 of the light emitting diodes LD to the second electrode ELT2.

In an embodiment, the first and second contact electrodes CNE1 and CNE2 may be disposed on different layers over the substrate SUB. In this case, the first and second contact electrodes CNE1 and CNE2 may be successively formed. For example, after the first contact electrode CNE1 is formed on the first electrode ELT1, the second insulating layer INS2 may be formed to overlap the first contact electrode CNE1. Thereafter, the second contact electrode CNE2 may be formed on the second insulating layer INS2.

In an embodiment, the first and second contact electrodes CNE1 and CNE2 may be disposed on the same layer of the substrate SUB at positions spaced apart from each other. In this case, the first and second contact electrodes CNE1 and CNE2 may be simultaneously formed.

<ST700: The Step of Forming the Encapsulation Layer>

Thereafter, the encapsulation layer ENC may be formed on the substrate SUB on which the first and second contact electrodes CNE1 and CNE2 are formed. Therefore, the display element layer including the first and second electrodes ELT1 and ELT2, the light emitting diodes LD, the first and second contact electrodes CNE1 and CNE2, or the like may be reliably protected.

Figure 11A:
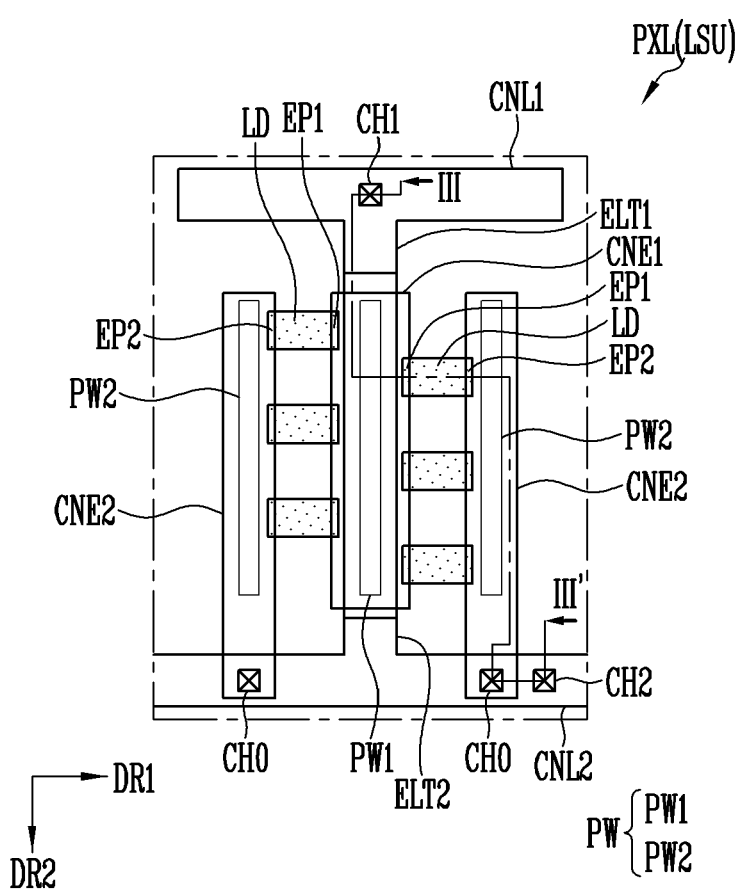
FIG. 11A is a plan view schematically illustrating a light emitting device in accordance with an embodiment of the disclosure, and for example illustrates an embodiment of a pixel including the light emitting device.
Figure 11B:
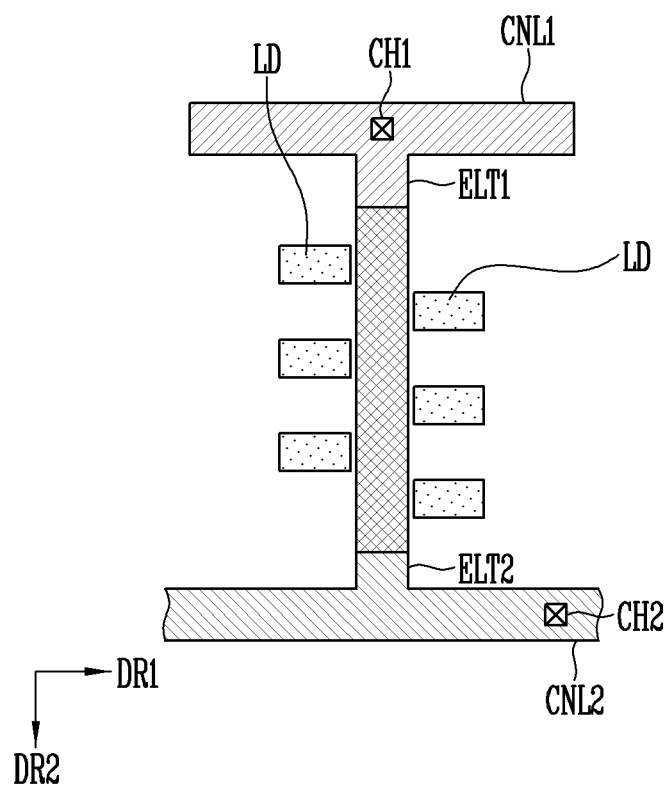
FIG. 11B is a plan view schematically illustrating a relative disposition relationship of first and second electrodes and light emitting diodes in accordance with the embodiment of FIG. 11A.
Figure 12A:
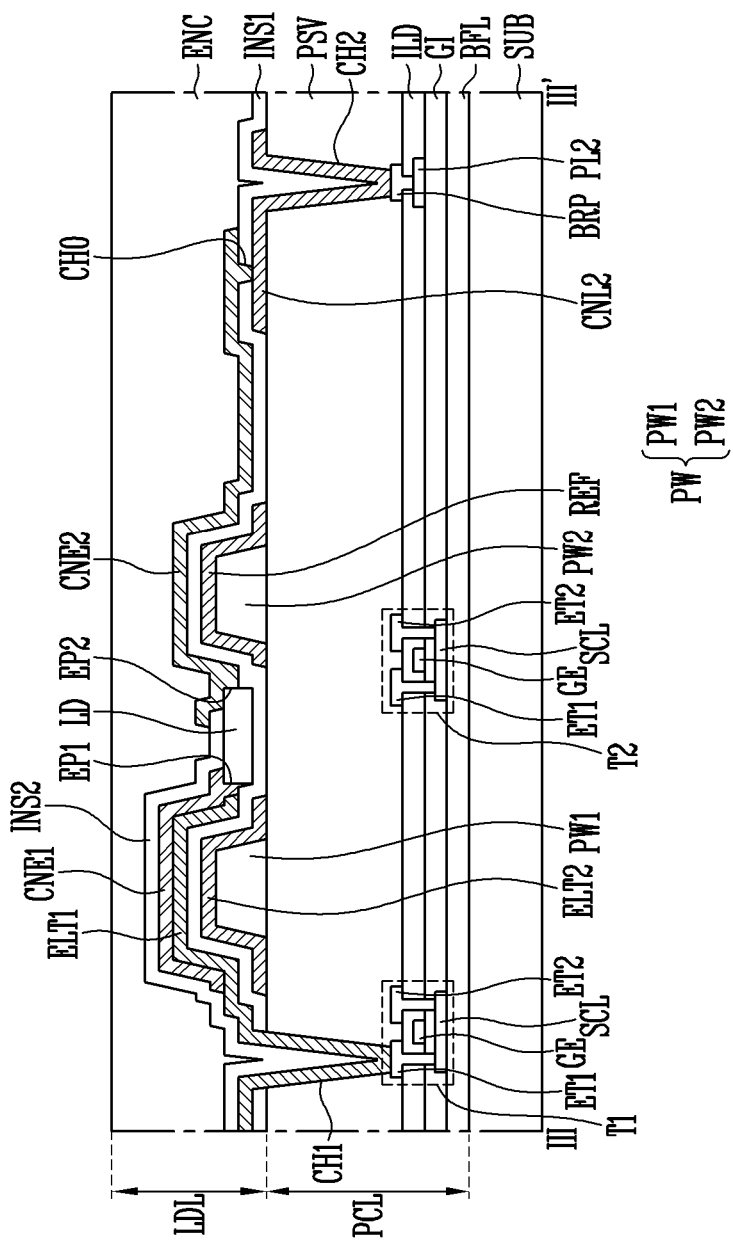
FIGS. 12A and 12B each are a cross-sectional view illustrating a light emitting device in accordance with an embodiment of the disclosure, and for example illustrate different embodiments of a cross-section corresponding to line III-III' of FIG. 11A.
Figure 12B:
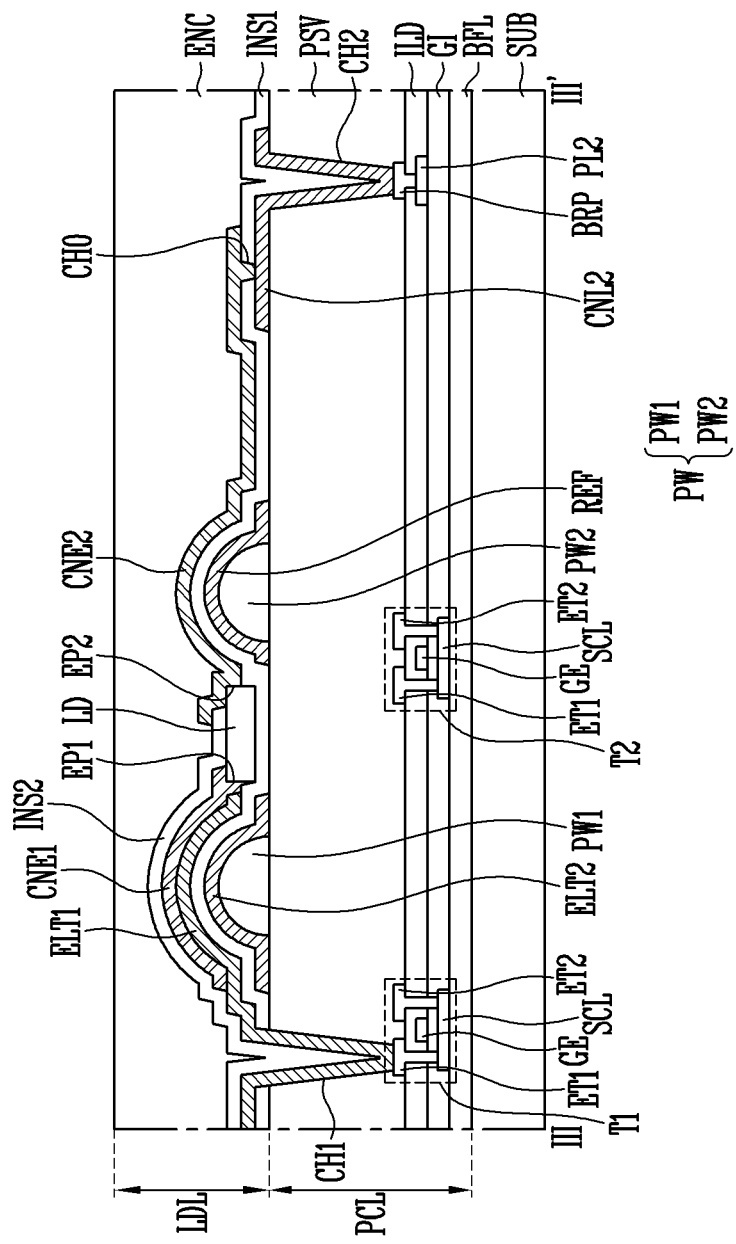

FIG. 11A is a plan view schematically illustrating a light emitting device in accordance with an embodiment, and for example, illustrates an embodiment of the pixel PXL including the light emitting device. FIG. 11B is a plan view schematically illustrating a relative disposition relationship of the first and second electrodes ELT1 and ELT2 and the light emitting diodes LD in accordance with the embodiment of FIG. 11A. FIGS. 12A and 12B each are a cross-sectional view schematically illustrating a light emitting device in accordance with an embodiment, and for example, illustrate different embodiments of a cross-section taken along line III-III' of FIG. 11A. In the description of the embodiment of FIGS. 11A to 12B, like reference numerals will be used to denote components similar or identical to those of the previous embodiments, and detailed descriptions thereof will be omitted.

In an embodiment, FIGS. 11A to 12B illustrate a light emitting device (e.g., a pixel PXL of an active light emitting display device) in which first or/and second electrodes ELT1 or/and ELT2 are respectively a first power line PL1 and a second power line PL2 through at least one contact hole, or the first or/and second electrodes ELT1 or/and ELT2 are electrically connected to the first power line PL1 or the second power line PL2 via at least one circuit element (e.g., at least one transistor included in the pixel circuit PXC of FIGS. 5A to 5C).

In an embodiment, the light source unit LSU illustrated in FIG. 11A may have a configuration substantially similar or identical to that of the light emitting device (or pixel PXL) according to the above-described embodiment, e.g., the embodiment illustrated in FIG. 8. Furthermore, a display element layer LDL illustrated in FIGS. 12A and 12B may have a cross-section substantially similar or identical to that of the light emitting device (or pixel PXL) according to the embodiment(s) illustrated in FIGS. 9A and 9B. In the following description of the embodiment of FIGS. 11A to 12B, like reference numerals are used to denote the identical or similar components to those of not only the embodiment of FIGS. 8 to 9B but also at least one of the above-described embodiments, and detailed descriptions thereof will be omitted.

The embodiment will be described with reference to FIGS. 11A to 12B along with FIGS. 4 to 10. Each pixel PXL may include a display element layer LDL which includes first and second electrodes ELT1 and ELT2 disposed to overlap each other on different layers over the substrate SUB, and at least one light emitting diode LD electrically connected between the first and second electrodes ELT1 and ELT2, and each pixel PXL may further include a circuit element layer PCL disposed under the display element layer LDL. For example, the circuit element layer PCL may be disposed between the substrate SUB and the display element layer LDL.

In an embodiment, the circuit element layer PCL may include circuit elements disposed in the display area DA. For example, the circuit element layer PCL may include circuit elements which are disposed in respective pixel areas to form the respective pixel circuits PXC. In other words, in an embodiment, the circuit element layer PCL may be a pixel circuit layer.

For example, the circuit element layer PCL may include transistors disposed in each pixel area, e.g., the first and second transistors T1 and T2 of FIGS. 5A and 5B, and at least one capacitor, e.g., the storage capacitor Cst of FIGS. 5A and 5B. Furthermore, the circuit element layer PCL may further include at least one scan line Si, at least one data line Dj, a first power line PL1, and/or a second power line PL2.

In an embodiment, transistors, e.g., first and second transistors T1 and T2, provided in each pixel circuit PXC may have a substantially identical or similar cross-sectional structure. However, the disclosure is not limited thereto. In an embodiment, at least some of the transistors may have different types and/or structures.

The circuit element layer PCL may include insulating layers. For example, the circuit element layer PCL may include a buffer layer BFL, a gate insulating layer GI, an interlayer insulating layer ILD, and a passivation layer PSV which are successively stacked on a surface of the substrate SUB.

In an embodiment, the buffer layer BFL may prevent impurities from diffusing into each circuit element. The buffer layer BFL may be formed of a single layer or may be formed of multiple layers having at least two layers. In the case where the buffer layer BFL has a multi-layer structure, the respective layers may be formed of the same material or different materials. In an embodiment, the buffer layer BFL may be omitted.

In an embodiment, each of the first and second transistors T1 and T2 may include a semiconductor layer SCL, a gate electrode GE, a first transistor electrode ET1, and a second transistor electrode ET2. Although FIGS. 12A and 12B illustrate an embodiment in which each of the first and second transistors T1 and T2 includes the first transistor electrode ET1 and the second transistor electrode ET2 that are formed separately from the semiconductor layer SCL, but the disclosure is not limited thereto. For example, in an embodiment, the first and/or second transistor electrode ET1 and/or ET2 provided in at least one transistor that forms each pixel circuit PXC may be integral with the corresponding semiconductor layer SCL.

The semiconductor layer SCL may be disposed on the buffer layer BFL. For example, the semiconductor layer SCL may be disposed between the gate insulating layer GI and the substrate SUB on which the buffer layer BFL is formed. The semiconductor layer SCL may include a first area which contacts the first transistor electrode ET1, a second area which contacts the second transistor electrode ET2, and a channel area disposed between the first and second areas. In an embodiment, one of the first and second areas may be a source area, and the other may be a drain area.

In an embodiment, the semiconductor layer SCL may be a semiconductor pattern formed of polysilicon, amorphous silicon, an oxide semiconductor, or the like. The channel area of the semiconductor layer SCL may be an intrinsic semiconductor, which is an undoped semiconductor pattern. Each of the first and second areas of the semiconductor layer SCL may be a semiconductor pattern doped with a predetermined impurity.

The gate electrode GE may be disposed on the semiconductor layer SCL with the gate insulating layer GI interposed therebetween. For example, the gate electrode GE may be disposed between the gate insulating layer GI and the interlayer insulating layer ILD and overlap at least one area of the semiconductor layer SCL.

The first and second transistor electrodes ET1 and ET2 may be disposed over the semiconductor layer SCL and the gate electrode GE with at least one interlayer insulating layer ILD interposed therebetween. For example, the first and second transistor electrodes ET1 and ET2 may be disposed between the interlayer insulating layer ILD and the passivation layer PSV. The first and second transistor electrodes ET1 and ET2 may be electrically connected to the semiconductor layer SCL. For example, the first and second transistor electrodes ET1 and ET2 may be respectively connected to the first area and the second area of the semiconductor layer SCL through corresponding contact holes which pass through the gate insulating layer GI and the interlayer insulating layer ILD.

In an embodiment, one of the first and second transistor electrodes ET1 and ET2 of at least one transistor (e.g., the first transistor T1 of FIGS. 5A and 5B) provided on the pixel circuit PXC may be electrically connected, through the first contact hole CH1 passing through the passivation layer PSV, to the first electrode ELT1 of the light source unit LSU disposed on the passivation layer PSV.

In an embodiment, at least one signal line and/or power line that is electrically connected to each pixel PXL may be disposed on a layer identical to that of an electrode of each of the circuit elements that form the pixel circuit PXC. For example, the second power line PL2 for supplying the second power supply VSS may be disposed on a layer identical to that of the gate electrodes GE of the first and second transistors T1 and T2, and may be electrically connected to the second connection electrode CNL2 and the second electrode ELT2 of the light source unit LSU that is disposed over the passivation layer PSV, through a bridge pattern BRP disposed on the same layer as that of the first and second transistor electrodes ET1 and ET2 and through at least one second contact hole CH2 passing through the passivation layer PSV. However, the structure and/or position of the second power line PL2 may be changed in various ways.

The display element layer LDL is a layer in which the light source unit LSU of each pixel PXL is disposed and, for example, may be configured in a manner substantially identical or similar to that of the light emitting device of the pixel PXL described with reference to FIGS. 8 to 9B. For example, the display element layer LDL may include first and second electrodes ELT1 and ELT2 disposed to overlap each other in each pixel area over the circuit element layer PCL, and at least one light emitting diode LD electrically connected between the first and second electrodes ELT1 and ELT2. For example, the display element layer LDL may include light emitting diodes LD which are disposed over the circuit element layer PCL in each pixel area and configure (or form) each light source unit LSU. The display element layer LDL may further include, e.g., at least one insulating layer (or insulating pattern) and/or electrode. For example, the display element layer LDL may further include at least one of the first and second partition walls PW1 and PW2, the first and second insulating layers INS1 and INS2, the first and second contact electrodes CNE1 and CNE2, and the encapsulation layer ENC of the embodiments described with reference to FIGS. 6 to 9B.

In the above-mentioned embodiment, the light source unit LSU of each pixel PXL may be formed of a light emitting device including at least one light emitting diode LD, and first and second electrodes ELT1 and ELT2 electrically connected to the opposite ends of the light emitting diode LD. Since the light emitting device according to an embodiment has been described above, detailed descriptions of each light source unit LSU corresponding to the light emitting device and the display element layer LDL for configuring the light source unit LSU will be omitted.

In an embodiment, at least one first circuit element and/or at least one line that is disposed on the circuit element layer PCL may overlap the first and/or second electrodes ELT1 and ELT2 of the display element layer LDL. For example, the first transistor T1 may overlap an area of the first electrode ELT1 or the first connection electrode CNL1 and be electrically connected to the first electrode ELT1 through the first contact hole CH1. As another example, in an embodiment, in the case where the first electrode ELT1 is directly connected to the first power line PL1, an area of the first power line PL1 may overlap the first electrode ELT1 and be electrically connected to the first electrode ELT1 through at least one contact hole.

In an embodiment, the second power line PL2 may overlap an area of the second electrode ELT2 or the second connection electrode CNL2 and thus be electrically connected to the second electrode ELT2 through the second contact hole CH2. In an embodiment, the second electrode ELT2 may be connected to the second power line PL2 via at least one second circuit element. In this case, the second circuit element may overlap an area of the second electrode ELT2 or the second connection electrode CNL2 and thus be electrically connected to the second electrode ELT2 through at least one contact hole.

As described above, at least a circuit element and/or a line that is disposed on the circuit element layer PCL may overlap at least one electrode and/or the light emitting diode LD of the display element layer LDL. If the circuit element layer PCL and the display element layer LDL are disposed to overlap each other, the pixel area that is limited in area may be more efficiently used.

Figure 13A:
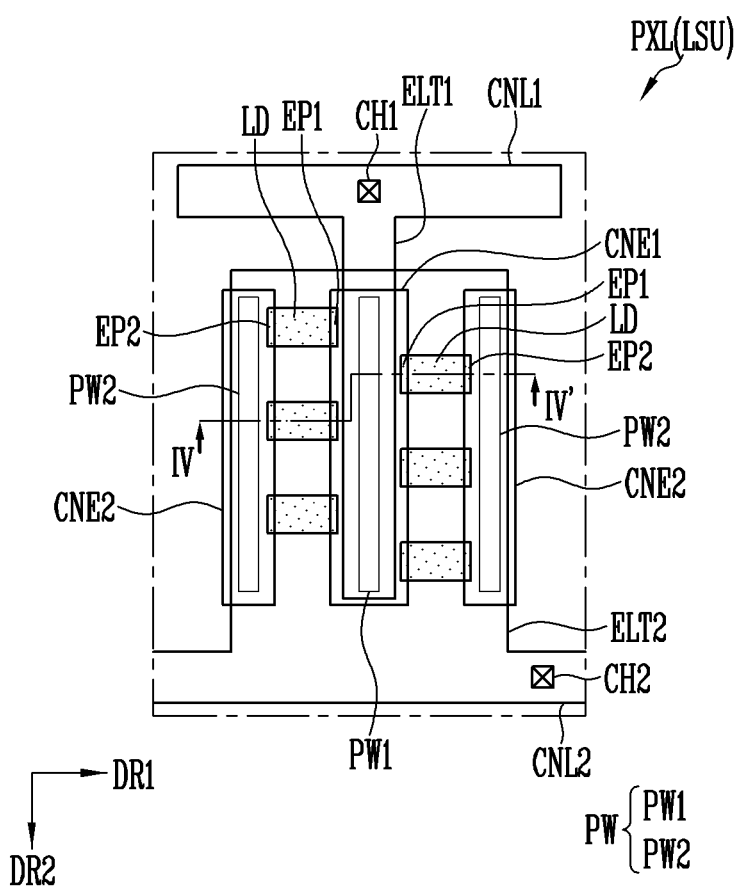
FIG. 13A is a plan view schematically illustrating a light emitting device in accordance with an embodiment of the disclosure, and for example illustrates an embodiment of a pixel including the light emitting device.
Figure 13B:
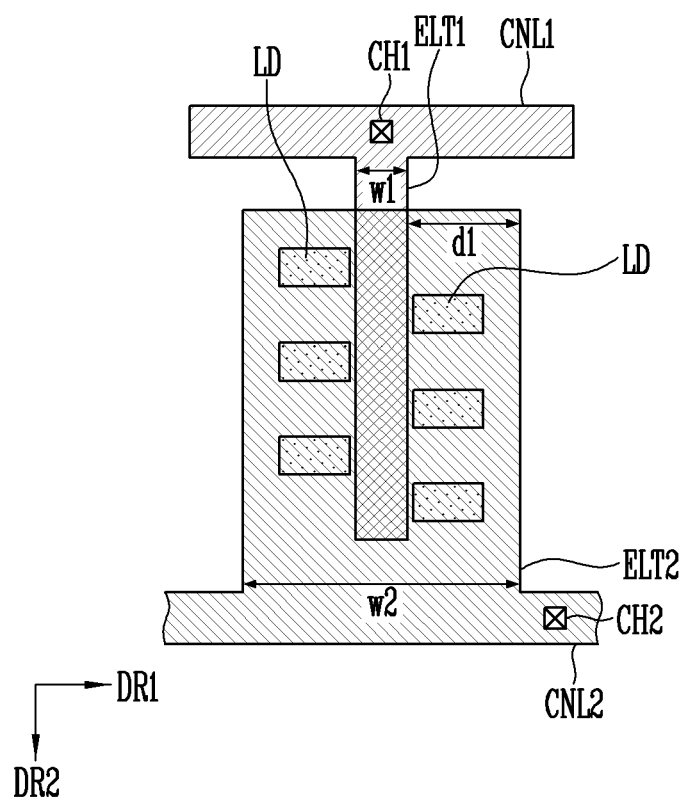
FIG. 13B is a plan view schematically illustrating a relative disposition relationship of first and second electrodes and light emitting diodes in accordance with the embodiment of FIG. 13A.
Figure 14:
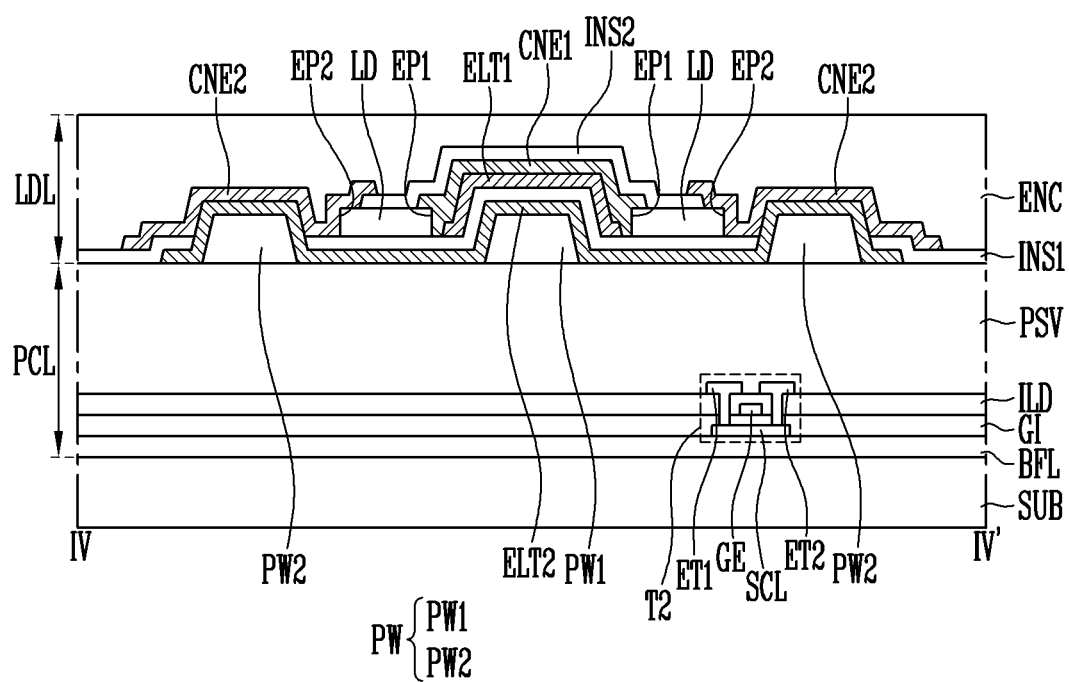
FIG. 14 is a cross-sectional view schematically illustrating a light emitting device in accordance with an embodiment of the disclosure, and for example illustrates an embodiment of a cross-section corresponding to line IV-IV' of FIG. 13A.

FIG. 13A is a plan view schematically illustrating a light emitting device in accordance with an embodiment, and for example, illustrates an example of the pixel PXL including the light emitting device. FIG. 13B is a plan view schematically illustrating a relative disposition relationship of the first and second electrodes ELT1 and ELT2 and the light emitting diodes LD in accordance with the embodiment of FIG. 13A. FIG. 14 is a cross-sectional view schematically illustrating a light emitting device in accordance with an embodiment, and for example, illustrates an embodiment of a cross-section taken along line IV-IV' of FIG. 13A. In the description of the embodiment(s) of FIGS. 13A to 14, like reference numerals will be used to denote components similar or identical to those of the previous embodiments, and detailed descriptions thereof will be omitted.

Referring to FIGS. 13A to 14, the first and second electrodes ELT1 and ELT2 may have different widths. For example, in an area in which at least the first and second electrodes ELT1 and ELT2 overlap each other, the second electrode ELT2 may have a width greater than that of the first electrode ELT1 and may be disposed under the first electrode ELT1.

In an embodiment, the second electrode ELT2 may have a width w2 long enough to overlap the first electrode ELT1, the light emitting diodes LD disposed adjacent to the first electrode ELT1 such that the respective first ends EP1 thereof face the first electrode ELT1, and the first and second partition walls PW1 and PW2 adjacent to the first and second ends EP1 and EP2 of the light emitting diodes LD. However, the disclosure is not limited thereto, and the width w2 or shape of the second electrode ELT2 may be changed in various ways. For example, in an embodiment, the second electrode ELT2 may have a width w2 greater than a width w1 of the first electrode ELT1 and may be disposed under the first electrode ELT1, and the second electrode ELT2 may also have an appropriate width to overlap only some respective portions of the light emitting diodes LD disposed on at least one side of the first electrode ELT1. In this case, the second electrode ELT2 along with the first electrode ELT1 may overlap only an area of each of the light emitting diodes LD and may not overlap at least one partition wall, e.g., each second partition wall PW2.

The light emitting diodes LD may be disposed at self-aligned positions by an electric field formed between the first and second electrodes ELT1 and ELT2 by a predetermined alignment voltage applied to the first and second electrodes ELT1 and ELT2 during an alignment process. The magnitude of the electric field may be changed according to the sizes of the first and second electrodes ELT1 and ELT2 (e.g., the widths w1 and w2 or surface areas of the first and second electrodes ELT1 and ELT2) and relative positions (e.g., a distance d1 between corresponding edges such as left or right ends of the first and second electrodes ELT1 and ELT2). Therefore, the positions at which the light emitting diodes LD are arranged may be controlled by adjusting the sizes and positions of the first and/or second electrodes ELT1 and ELT2.

Each partition wall PW may be disposed adjacent to an end of each of the light emitting diodes LD. For example, the first partition wall PW1 may be disposed adjacent to the first end EP1 of at least one light emitting diode LD, and the second partition wall PW2 may be disposed adjacent to the second end EP2 of at least one light emitting diode LD. In an embodiment, each partition wall PW may have a cross-section the width of which reduces upward, e.g., a trapezoidal cross-section, but the disclosure is not limited thereto. For example, in an embodiment, each partition wall PW may have a cross-section including a curved surface such as a semi-circular or semi-elliptical cross-section, as described in the embodiments illustrated in FIGS. 9B and 12B.

In an embodiment, in the case where the second electrode ELT2 has a width w2 long enough to overlap the first and second partition walls PW1 and PW2, the first and second partition walls PW1 and PW2 may be disposed under the second electrode ELT2. For example, the first and second partition walls PW1 and PW2 may be disposed between the second electrode ELT2 and the substrate SUB (or a surface of the substrate SUB on which the buffer layer BFL and/or the circuit element layer PCL are formed). In other words, in an embodiment, the first and second partition walls PW1 and PW2 may be overlapped by the second electrode ELT2. In this case, light emitted from the opposite ends of each of the light emitting diodes LD, i.e., the first and second ends EP1 and EP2, may more effectively travel in the frontal direction, even without using a separate reflective layer REF or the like disclosed with reference to the embodiment(s) of FIGS. 9A and 9B. Therefore, the optical efficiency of the light emitting device (or the pixel PXL including the light emitting device) may be enhanced.

In an embodiment, in the case where at least one partition wall PW does not overlap the first and/or second electrodes ELT1 and ELT2, a separate reflective layer, e.g., the reflective layer REF disclosed with reference to the embodiment(s) of FIGS. 9A and 9B, may be disposed over the partition wall PW. As another example, in an embodiment, the partition wall PW itself may include reflective material. Therefore, the optical efficiency of the light emitting device may be enhanced.

As described in the foregoing embodiment, the sizes and relative positions of the first and second electrodes ELT1 and ELT2 may be changed in various ways. The adjustment in size and/or relative position of the first and/or second electrodes ELT1 and ELT2 may make it easy to control the magnitude of the electric field formed between the first and second electrodes ELT1 and ELT2 during the alignment process of the light emitting diodes LD and may make it easy to control the alignment positions of the light emitting diodes LD.

Figure 15:
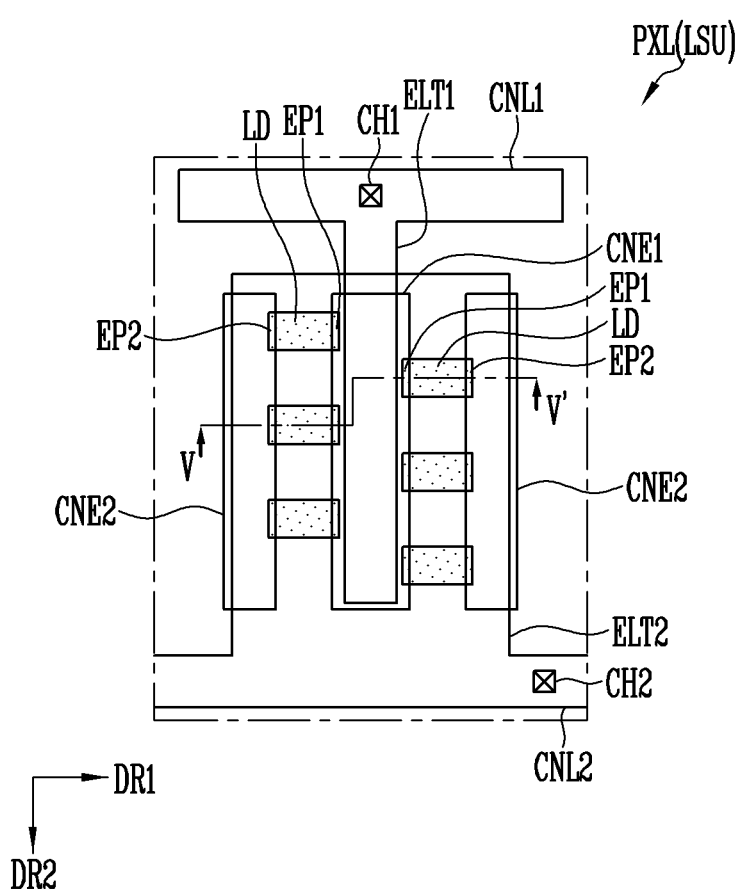
FIG. 15 is a plan view schematically illustrating a light emitting device in accordance with an embodiment of the disclosure, and for example illustrates an embodiment of a pixel including the light emitting device.
Figure 16:
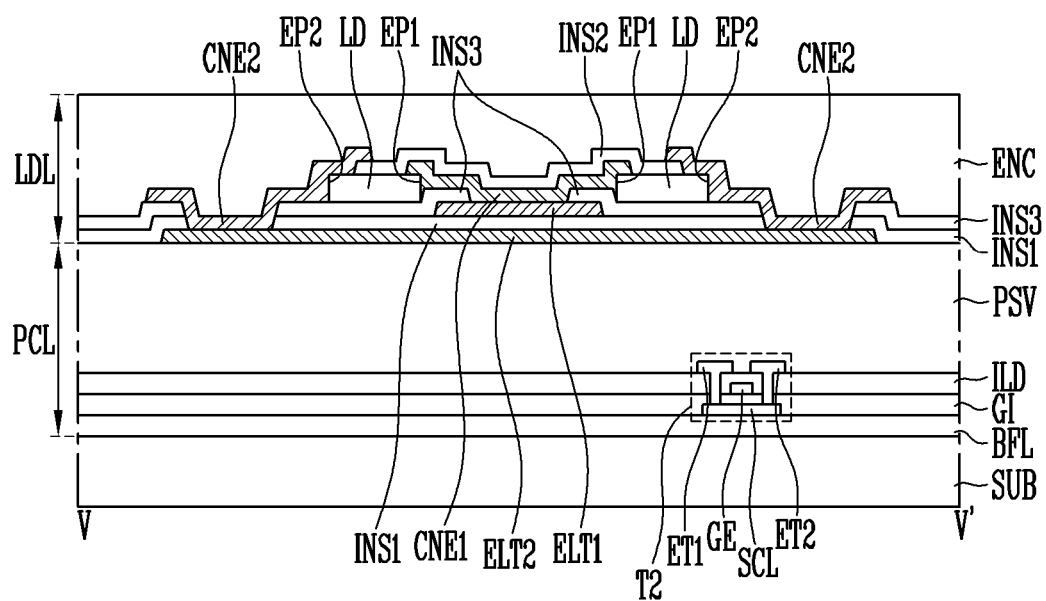
FIG. 16 is a cross-sectional view schematically illustrating a light emitting device in accordance with an embodiment of the disclosure and for example illustrates an embodiment of a cross-section corresponding to line V-V' of FIG. 15.

FIG. 15 is a plan view schematically illustrating a light emitting device in accordance with an embodiment, and for example, illustrates an example of a pixel PXL including the light emitting device. FIG. 16 is a cross-sectional view schematically illustrating a light emitting device in accordance with an embodiment, and for example illustrates an embodiment of a cross-section taken along line V-V' of FIG. 15. In the description of the embodiment(s) of FIGS. 15 and 16, like reference numerals are used to denote components similar or identical to those of the above-described embodiments, e.g., the embodiments of FIGS. 13A to 14, and detailed descriptions thereof will be omitted.

Referring to FIGS. 15 and 16, the first and/or second partition walls PW1 and PW2 disclosed with reference to the embodiments of FIGS. 13A to 14 may be omitted. In this case, the first or/and second electrodes ELT1 or/and ELT2 may have a substantially planar shape.

In an embodiment, the emission area of each pixel PXL (e.g., an area in which the light emitting diodes LD are supplied and aligned between the first and second electrodes ELT1 and ELT2) may be enclosed by a bank layer, a dam structure, or the like, which is not illustrated. The bank layer, the dam structure, or the like may include a reflective layer on a surface thereof. As another example, in an embodiment, a separate light guide structure, a separate reflective structure, or the like may be disposed around the light emitting diodes LD. According to the embodiments, in case that the first or/and second partition walls PW1 and PW2 are not provided, the optical efficiency of the light emitting device may be enhanced.

In an embodiment, the light emitting device may further include at least one insulating layer directly disposed on the first electrode ELT1. For example, the light emitting device may further include a third insulating layer INS3 directly disposed on the first electrode ELT1 to overlap at least one area of the first electrode ELT1. The light emitting diodes LD may be supplied and aligned on the substrate SUB on which the third insulating layer INS3 is formed. Since the third insulating layer INS3 is formed, the first electrode ELT1 may be prevented from being damaged during a subsequent process after the first electrode ELT1 has been formed.

The third insulating layer INS3 may be partially open in an area of the first electrode ELT1. The first contact electrode CNE1 may be formed to overlap an upper portion of at least one area of the first electrode ELT1 in addition to an area in which the third insulating layer INS3 is open. Therefore, the first electrode ELT1 may be electrically connected to the first contact electrode CNE1.

Figure 17A:
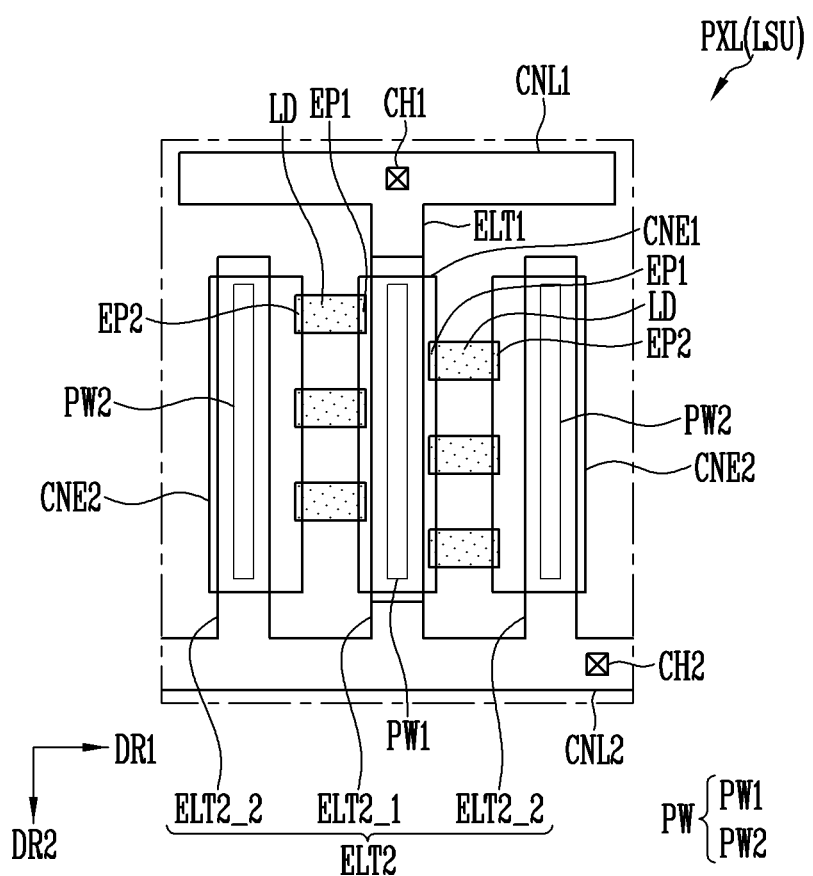
FIG. 17A is a plan view schematically illustrating a light emitting device in accordance with an embodiment of the disclosure, and for example illustrates an embodiment of a pixel including the light emitting device.
Figure 17B:
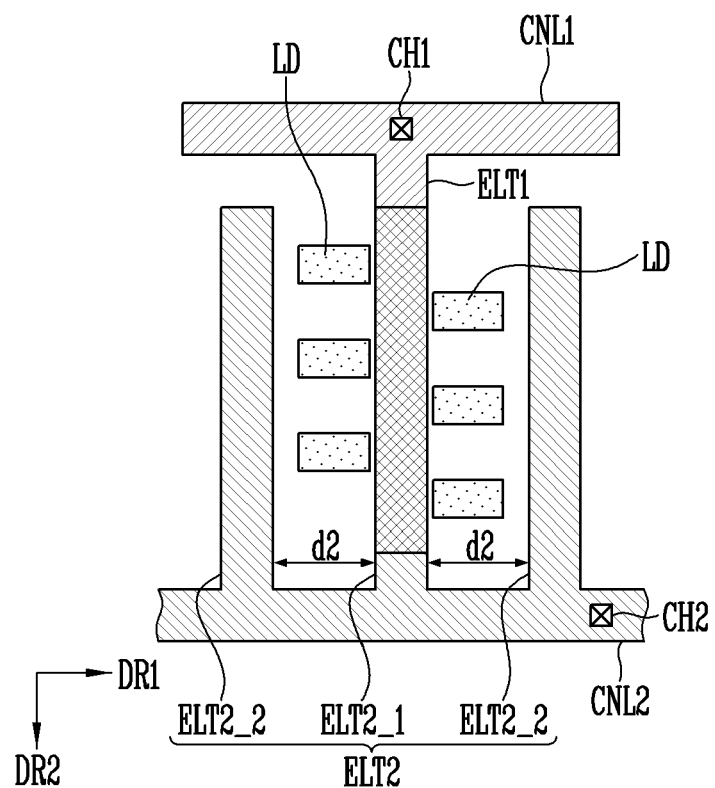
FIG. 17B is a plan view schematically illustrating a relative disposition relationship of first and second electrodes and light emitting diodes in accordance with the embodiment of FIG. 17A.

FIG. 17A is a plan view schematically illustrating a light emitting device in accordance with an embodiment, and for example, illustrates an example of the pixel PXL including the light emitting device. FIG. 17B is a plan view schematically illustrating a relative disposition relationship of the first and second electrodes ELT1 and ELT2 and the light emitting diodes LD in accordance with the embodiment of FIG. 17A. In the description of the embodiment(s) of FIGS. 17A and 17B, like reference numerals are used to denote components similar or identical to those of the above-described embodiments, e.g., the embodiments of FIGS. 11A to 12B, and detailed descriptions thereof will be omitted.

Referring to FIGS. 17A and 17B, the numbers of first and second electrodes ELT1 and ELT2 may be different from each other. For example, the number of second electrodes ELT2 disposed in each emission area may be greater than that of the first electrodes ELT1.

In an embodiment, some of the second electrodes ELT2 may overlap the first electrode ELT1, and the other second electrodes ELT2 may not overlap the first electrode ELT1. For example, the second electrodes ELT2 may include at least one first sub-electrode ELT2_1 which overlaps each first electrode ELT1, and at least one second sub-electrode ELT2_2 disposed at a position spaced apart from the first electrode ELT1 and the first sub-electrode ELT2_1. For example, the light emitting device may include a first electrode ELT1 and a first sub-electrode ELT2_1 which are disposed to overlap each other in a corresponding emission area, and two second sub-electrodes ELT2_2 which are disposed on opposite sides of the first sub-electrode ELT2_1 at positions spaced apart from the first sub-electrode ELT2_1. However, the disclosure is not limited thereto. For example, in an embodiment, second electrodes ELT2 may be disposed in each emission area and may be disposed not to overlap the first electrode ELT1.

In an embodiment, each second sub-electrode ELT2_2 may be disposed at a position spaced apart from the first electrode ELT1 and the first sub-electrode ELT2_1 by a predetermined distance d2 (or an interval) in a plan view. In an embodiment, when it is assumed that second sub-electrodes ELT2_2, e.g., two second sub-electrodes ELT2_2, are disposed on opposite sides of the first sub-electrode ELT2_1, the second sub-electrodes ELT2_2 may be disposed at positions spaced apart from the first sub-electrode ELT2_1 by an identical or different distances d2. However, the disclosure is not limited thereto.

In an embodiment, each light emitting diode LD may be oriented in a horizontal direction between the first electrode ELT1 and the second sub-electrode ELT2_2 in a plan view. For example, each light emitting diode LD may be a rod-type light emitting diode having a first end EP1 and a second end EP2 on respective opposite ends thereof in a longitudinal direction. The first and second ends EP1 and EP2 may be respectively disposed toward the first electrode ELT1 and the second sub-electrode ELT2_2.

In the foregoing embodiment, the numbers and the relative positions of the first and second electrodes ELT1 and ELT2 (e.g., the distance d2 between the first electrode ELT1 and the second sub-electrode ELT2_2 adjacent thereto) may be changed in various ways. The adjustment in number and/or relative position of the first and/or second electrodes ELT1 and ELT2 may make it easy to control the magnitude of the electric field formed between the first and second electrodes ELT1 and ELT2 during the alignment process of the light emitting diodes LD and may make it easy to control the alignment positions of the light emitting diodes LD.

Figure 18A:
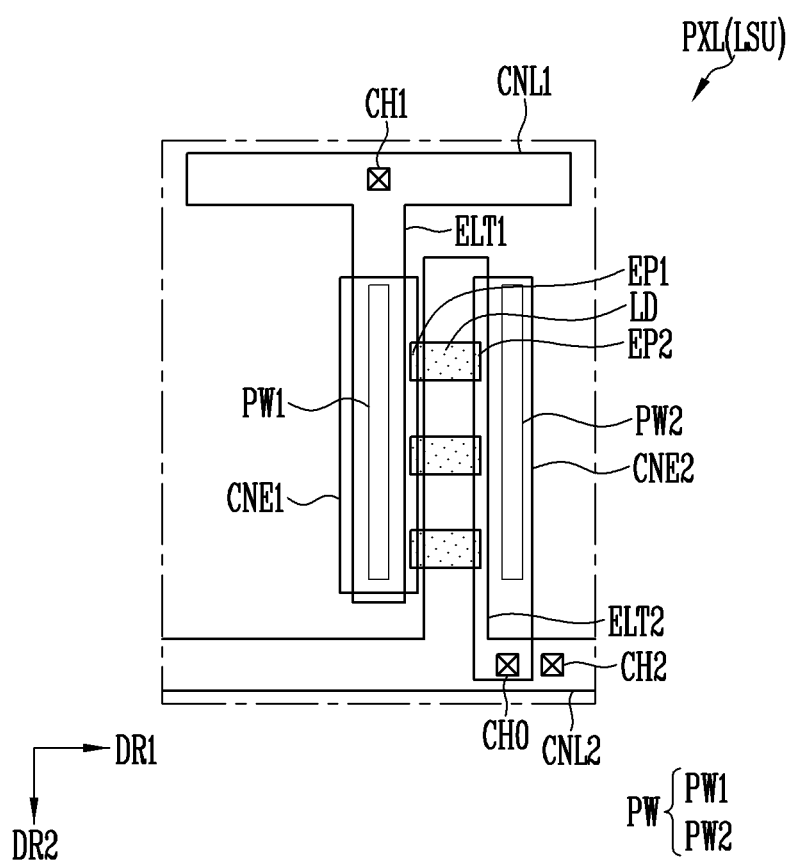
FIG. 18A is a plan view schematically illustrating a light emitting device in accordance with an embodiment of the disclosure, and for example illustrates an embodiment of a pixel including the light emitting device.
Figure 18B:
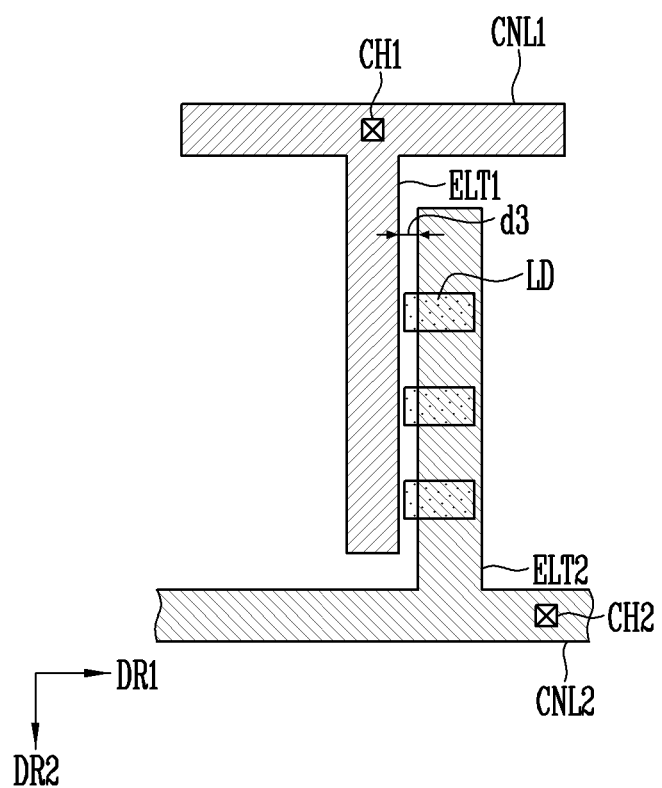
FIG. 18B is a plan view schematically illustrating a relative disposition relationship of first and second electrodes and light emitting diodes in accordance with the embodiment of FIG. 18A.

FIG. 18A is a plan view schematically illustrating a light emitting device in accordance with an embodiment, and for example, illustrates an example of the pixel PXL including the light emitting device. FIG. 18B is a plan view schematically illustrating a relative disposition relationship of the first and second electrodes ELT1 and ELT2 and the light emitting diodes LD in accordance with the embodiment of FIG. 18A. In the description of the embodiment(s) of FIGS. 18A and 18B, like reference numerals are used to denote components similar or identical to those of the above-described embodiments, e.g., the embodiments of FIGS. 11A to 12B, and detailed descriptions thereof will be omitted.

Referring to FIGS. 18A and 18B, the numbers of first and second electrodes ELT1 and ELT2 may be alternately disposed not to overlap each other. For example, the first and second electrodes ELT1 and ELT2 may be spaced apart from each other by a predetermined distance d3 not to overlap each other in a plan view.

In an embodiment, the first and second electrodes ELT1 and ELT2 may be disposed in a predetermined emission area at positions spaced apart from each other by the predetermined distance d3 in the first direction DR1. For example, each of the first and second electrodes ELT1 and ELT2 may be provided in the form of a bar extending in the same direction, e.g., in the second direction DR2, and be disposed parallel to each other at a uniform interval.

In the foregoing embodiment, the first and second electrodes ELT1 and ELT2 may be disposed on different layers with at least the first insulating layer INS1 interposed therebetween in the same manner as that of the previous embodiments. Therefore, the probability of a short-circuit defect of the first and second electrodes ELT1 and ELT2 may be reduced, so that the distance between the first and second electrodes ELT1 and ELT2 may be further reduced. For example, the thickness of the first insulating layer INS1 and/or the distance d3 between the first and second electrodes ELT1 and ELT2 may be reduced. Hence, during the process of aligning the light emitting diodes LD, the magnitude of the electric field between the first and second electrodes ELT1 and ELT2 may be increased, so that the light emitting diodes LD may be efficiently aligned. Furthermore, since the positions of the first and second electrodes ELT1 and ELT2, the thickness of the first insulating layer INS1, and/or the distance d3 between the first and second electrodes ELT1 and ELT2 may be adjusted, not only may the magnitude of the electric field formed between the first and second electrodes ELT1 and ELT2 during the process of aligning the light emitting diodes LD be easily controlled, but the aligned positions of the light emitting diodes LD may also be controlled. In other words, according to the foregoing embodiment, the light emitting diodes LD may be readily disposed at desired positions.

Figure 19A:
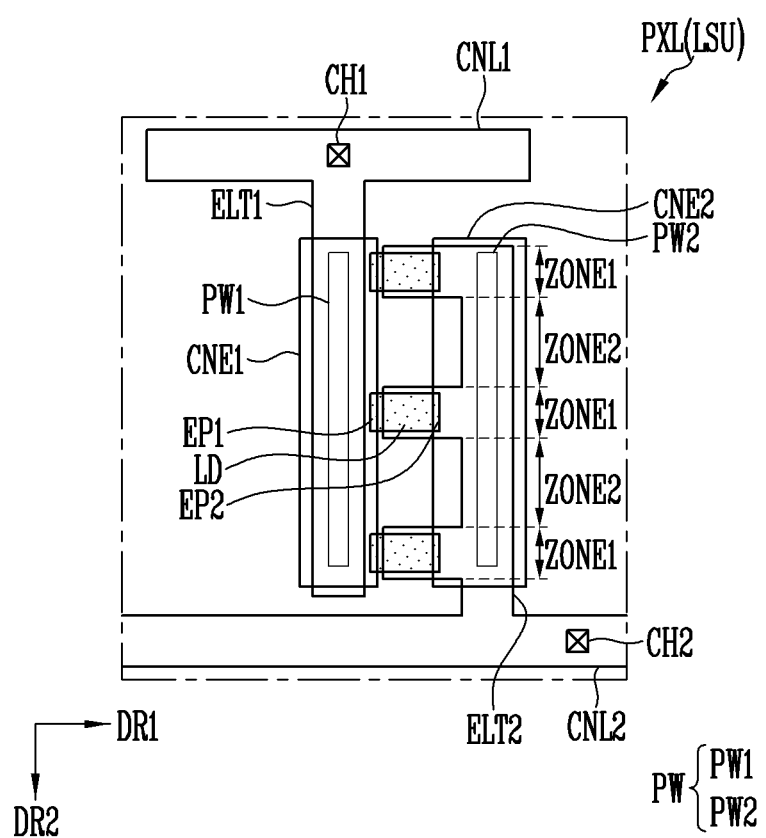
FIG. 19A is a plan view schematically illustrating a light emitting device in accordance with an embodiment of the disclosure, and for example illustrates an embodiment of a pixel including the light emitting device.
Figure 19B:
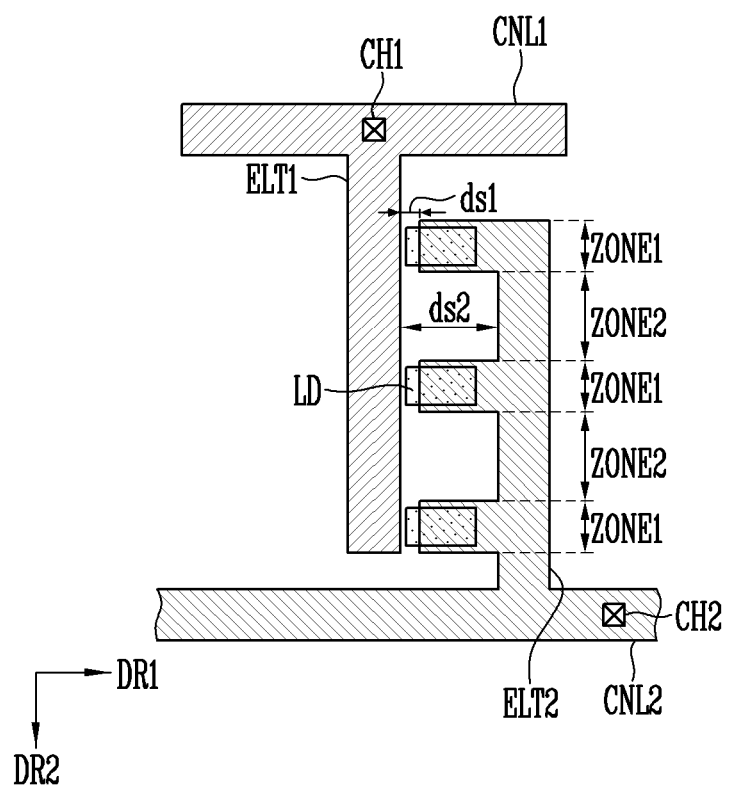
FIG. 19B is a plan view schematically illustrating a relative disposition relationship of first and second electrodes and light emitting diodes in accordance with the embodiment of FIG. 19A.

FIG. 19A is a plan view schematically illustrating a light emitting device in accordance with an embodiment, and for example, illustrates an example of the pixel PXL including the light emitting device. FIG. 19B is a plan view schematically illustrating a relative disposition relationship of the first and second electrodes ELT1 and ELT2 and the light emitting diodes LD in accordance with the embodiment of FIG. 19A. In the description of the embodiment(s) of FIGS. 19A and 19B, like reference numerals are used to denote components similar or identical to those of the above-described embodiments, e.g., the embodiments of FIGS. 18A and 18B, and detailed descriptions thereof will be omitted.

Referring to FIGS. 19A and 19B, the second electrode ELT2 may be a bent portion which is angled or bent in a curved shape in an area adjacent to the first electrode ELT1, e.g., in a left edge area adjacent to the first electrode ELT1. In this case, in each emission area, the distance (or the interval) between the first and second electrodes ELT1 and ELT2 may be changed according to areas.

For example, each emission area in which at least one pair of first and second electrodes ELT1 and ELT2 are disposed may include at least one first area ZONE1 and at least one second area ZONE2 which are successively arranged in an extension direction (e.g., the second direction DR2) of each of the first and second electrodes ELT1 and ELT2. For example, each emission area may include first and second areas ZONE1 and ZONE2 which are alternately arranged in the second direction DR2.

In an embodiment, in a plan view, the first and second electrodes ELT1 and ELT2 may be disposed in the first area ZONE1 at positions spaced apart from each other by a first distance ds1 and may be disposed in the second area ZONE2 adjacent to the first area ZONE1 at positions spaced apart from each other by a second distance ds2 greater than the first distance ds1. In this case, in case that predetermined alignment voltages are applied to the first and second electrodes ELT1 and ELT2 during the process of aligning the light emitting diodes LD, the electric field formed between the first and second electrodes ELT1 and ELT2 in the first area ZONE1 may be stronger than the electric field formed between the first and second electrodes ELT1 and ELT2 in the second area ZONE2. Therefore, the light emitting diodes LD may be intensively disposed in the first area ZONE1. For example, in the case where the first area ZONE1 large enough to arrange the light emitting diodes LD supplied to each emission area is secured, valid light emitting diodes LD which contribute to actual emission (e.g., light emitting diodes LD validly connected between the first and second electrodes ELT1 and ELT2) may be disposed in the first area ZONE1.

In the foregoing embodiment, the distance between the first electrode ELT1 and the second electrode ELT2 in a plan view may be changed according to areas or sections. Furthermore, the first electrode ELT1 and/or the second electrode ELT2 may have a shape corresponding thereto. According to the foregoing embodiment, since the shape of the first and/or second electrode ELT1 and/or ELT2, and/or the distance between the first and second electrodes ELT1 and ELT2 are differently set in different areas, not only may the magnitude of the electric field between the first and second electrodes ELT1 and ELT2 in each area during the process of aligning the light emitting diodes LD be easily controlled, but the light emitting diodes LD can also be easily disposed at desired positions.

The light emitting device (e.g., the pixel PXL formed of the light emitting device or including the light emitting device), the fabricating method thereof, and the display device including the light emitting device in accordance with various embodiments described above may include a stacked electrode structure. For example, the first electrode ELT1 and the second electrode ELT2 may be disposed on different layers over the substrate SUB and separated from each other with at least the first insulating layer INS1 interposed therebetween.

As such, if the first electrode ELT1 and the second electrode ELT2 are separately disposed on different layers, a short-circuit defect between the first electrode ELT1 and the second electrode ELT2 may be effectively prevented from occurring during a process of fabricating the pixel PXL. Furthermore, a process margin between the first electrode ELT1 and the second electrode ELT2 may be reduced, so that the first and second electrodes ELT1 and ELT2 may be disposed closer to each other. In accordance with the above-mentioned embodiments, during the process of aligning the light emitting diodes LD, the electric field formed between the first and second electrodes ELT1 and ELT2 may be increased, so that the light emitting diodes LD can be efficiently and stably aligned between the first and second electrodes ELT1 and ELT2. Furthermore, since the sizes of the first and second electrodes ELT1 and ELT2, the relative disposition relationship therebetween, and/or the thickness of the first insulating layer INS1 may be adjusted, the magnitude of the electric field formed between the first and second electrodes ELT1 and ELT2 and the aligned positions of the light emitting diodes LD may be easily controlled during the process of aligning the light emitting diodes LD.

While the scope of the disclosure is described by detailed embodiments, it should be noted that the above-described embodiments are merely descriptive and should not be considered limiting. It should be understood by those skilled in the art that various changes, substitutions, and alternations may be made herein without departing from the scope of the disclosure.

The scope of the claimed invention is not limited by detailed descriptions of the specification and should be defined by the claims. Furthermore, all changes or modifications of the disclosure derived from the meanings and scope of the claims, and equivalents thereof should be construed as being included in the scope of the disclosure.

The invention claimed is:

1. A light emitting device comprising:
   at least one first electrode and at least one second electrode disposed on different layers on a substrate;
   a first insulating layer disposed between the at least one first electrode and the at least one second electrode; and
   at least one light emitting diode electrically connected between the at least one first electrode and the at least one second electrode, the at least one light emitting diode being rod shaped and having a length extending in a longitudinal direction parallel with a main surface of the substrate, the length being a longest dimension of the at least one light emitting diode wherein
   the at least one first electrode is disposed on the first insulating layer, and
   the at least one second electrode is disposed between the substrate and the first insulating layer to overlap the at least one first electrode.

2. The light emitting device according to claim 1, further comprising:
   a first contact electrode disposed on a first end of the at least one light emitting diode and an area of the at least one first electrode and the at least one second electrode and electrically connecting the first end to the at least one first electrode; and
   a second contact electrode disposed on a second end of the at least one light emitting diode and electrically connecting the second end to the at least one second electrode.

3. The light emitting device according to claim 2, further comprising:
   a first partition wall disposed between the substrate and the at least one first electrode and the at least one second electrode and disposed adjacent to the first end of the at least one light emitting diode; and a second partition wall disposed between the substrate and the second contact electrode and disposed adjacent to the second end of the at least one light emitting diode.

4. The light emitting device according to claim 1, further comprising at least one partition wall disposed between the substrate and the at least one second electrode and disposed adjacent to an end of the at least one light emitting diode.

5. The light emitting device according to claim 1, wherein a number of the at least one first electrode and a number of the at least one second electrode are different from each other, and the at least one second electrode comprises:
a first sub-electrode overlapping the at least one first electrode; and
at least one second sub-electrode spaced apart from the at least one first electrode and the first sub-electrode in a plan view.

6. The light emitting device according to claim 5, wherein the at least one light emitting diode comprises a rod-type light emitting diode oriented in a horizontal direction between the at least one first electrode and the at least one second electrode in a plan view.

7. The light emitting device according to claim 1, wherein each of the at least one first electrode and the at least one second electrode has a shape of at least one bar extending in an identical direction and is disposed parallel to each other with a constant distance.

8. The light emitting device according to claim 1, further comprising:
a first contact electrode disposed on a first end of the at least one light emitting diode to electrically connect the first end to the at least one first electrode, wherein
the first contact electrode includes a first distil end that terminates directly on an upper surface of the light emitting diode.

9. The light emitting device according to claim 8, further comprising:
a second contact electrode disposed on a second end of the at least one light emitting diode to electrically connect the second end to the at least one second electrode;
a second insulating layer disposed directly on both the at least one light emitting diode and the first contact electrode, wherein
the second contact electrode includes a second distil end that terminates directly on an upper surface of the second insulating layer directly over the at least one light emitting diode.

10. A light emitting device comprising:
at least one first electrode and at least one second electrode disposed on different layers on a substrate;
a first insulating layer disposed between the at least one first electrode and the at least one second electrode; and
at least one light emitting diode electrically connected between the at least one first electrode and the at least one second electrode, the at least one light emitting diode being rod shaped and having a length extending in a longitudinal direction parallel with a main surface of the substrate, the length being a longest dimension of the at least one light emitting diode, wherein
the at least one first electrode and the at least one second electrode overlap each other in at least one area and are spaced apart from each other, and
the first insulating layer is disposed between the at least one first electrode and the at least one second electrode in the at least one area.

11. The light emitting device according to claim 10, wherein
the at least one light emitting diode includes a first end and a second end spaced apart from the first end along the longitudinal direction of the at least one light emitting diode, the at least one light emitting diode being disposed adjacent to the at least one first electrode and the at least one second electrode,
the first end is an end of the at least one light emitting diode that faces the at least one first electrode and the at least one second electrode, and
the second end is another end of the at least one light emitting diode.

12. The light emitting device according to claim 10, wherein in a first area of the at least one area where the at least one first electrode and the at least one second electrode overlap each other, the at least one second electrode has a width greater than a width of the at least one first electrode.

13. The light emitting device according to claim 12, wherein
a first end of the at least one light emitting diode is disposed to face the at least one first electrode, and
at least one area of the at least one light emitting diode overlaps the at least one second electrode.

14. A method of fabricating a light emitting device, comprising:
forming a lower electrode on a substrate;
forming a first insulating layer on the substrate to overlap at least the lower electrode;
forming an upper electrode on the first insulating layer;
supplying at least one light emitting diode on the substrate including the lower electrode and the upper electrode, the at least one light emitting diode being rod shaped and having a length, the length being a longest dimension of the at least one light emitting diode;
aligning the at least one light emitting diode such that the length of the at least one light emitting diode extends in a longitudinal direction parallel with a main surface of the substrate, and such that an end of the at least one light emitting diode is adjacent to the upper electrode; and
electrically connecting the at least one light emitting diode between the lower electrode and the upper electrode, the electrically connecting including forming a first contact electrode and a second contact electrode that electrically connect ends of the at least one light emitting diode to the upper electrode and the lower electrode, respectively.

15. The method according to claim 14, further comprising forming at least one partition wall on the substrate before the forming of the lower electrode.

16. A display device comprising:
a substrate including a display area; and
a pixel disposed in the display area,
wherein the pixel comprises:
a first electrode and a second electrode disposed on different layers on the substrate;
a first insulating layer disposed between the first and the second electrodes; and
at least one light emitting diode electrically connected between the first and the second electrodes, the at least one light emitting diode being rod shaped and having a length extending in a longitudinal direction parallel with a main surface of the substrate, the length being a longest dimension of the at least one light emitting diode, wherein the first electrode and the second electrode are spaced apart from each other and do not overlap each other in a plan view, the second electrode includes a bent portion adjacent to the first electrode, and the first electrode and the second electrode are spaced apart from each other by a first distance in a first area and are spaced apart from each other by a second distance greater than the first distance in a second area adjacent to the first area.

17. The light emitting device according to claim 16, wherein each of the first electrode and the second electrode has a shape of at least one bar extending in an identical direction and is disposed parallel to each other with a constant distance.

18. The light emitting device according to claim 16, wherein the first and the second areas are successively arranged in an extension direction of each of the first electrode and the second electrode.

19. The light emitting device according to claim 16, wherein the at least one light emitting diode is disposed in the first area.

\* \* \* \* \*